（12） United States Patent
Umemoto et al.

(10) Patent No.: US 10,629,712 B2
(45) Date of Patent: *Apr. 21, 2020

(54) HETEROJUNCTION BIPOLAR TRANSISTOR

(71) Applicant: Murata Manufacturing Co., Ltd., Kyoto-fu (JP)

(72) Inventors: Yasunari Umemoto, Nagaokakyo (JP); Shigeki Koya, Nagaokakyo (JP); Isao Obu, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/026,841

(22) Filed: Jul. 3, 2018

(65) Prior Publication Data

US 2018/0331208 A1    Nov. 15, 2018

Related U.S. Application Data

(63) Continuation of application No. 15/898,440, filed on Feb. 17, 2018, now Pat. No. 10,056,476.

(30) Foreign Application Priority Data

Feb. 20, 2017   (JP) ................. 2017-028690

(51) Int. Cl.
*H01L 29/73*    (2006.01)
*H01L 29/737*    (2006.01)
(Continued)

(52) U.S. Cl.
CPC ...... *H01L 29/7371* (2013.01); *H01L 29/0817* (2013.01); *H01L 29/0821* (2013.01); *H01L 29/66242* (2013.01); *H01L 29/205* (2013.01)

(58) Field of Classification Search
CPC .............. H01L 29/7371; H01L 29/0817; H01L 29/0821; H01L 29/66242; H01L 29/205
See application file for complete search history.

(56) References Cited

U.S. PATENT DOCUMENTS 4,958,208 A * 9/1990 Tanaka ................ H01L 29/7371
257/12
6,399,969 B1    6/2002 Twynam
(Continued)

FOREIGN PATENT DOCUMENTS

JP    H08-330322 A    12/1996
JP    2000-332023 A    11/2000
(Continued)

*Primary Examiner* — William Coleman
(74) *Attorney, Agent, or Firm* — Studebaker & Brackett PC

(57) ABSTRACT

A collector layer of an HBT includes a high-concentration collector layer and a low-concentration collector layer thereon. The low-concentration collector layer includes a graded collector layer in which the energy band gap varies to narrow with increasing distance from the base layer. The electron affinity of the semiconductor material for the base layer is greater than that of the semiconductor material for the graded collector layer at the point of the largest energy band gap by about 0.15 eV or less. The electron velocity in the graded collector layer peaks at a certain electric field strength. In the graded collector layer, the strength of the quasi-electric field, an electric field that acts on electrons as a result of the varying energy band gap, is between about 0.3 times and about 1.8 times the peak electric field strength, the electric field strength at which the electron velocity peaks.

20 Claims, 14 Drawing Sheets

(51) Int. Cl.
*H01L 29/66* (2006.01)
*H01L 29/08* (2006.01)
*H01L 29/205* (2006.01)

(56) References Cited

U.S. PATENT DOCUMENTS

| | | |
|---|---|---|
| 6,797,996 B1 | 9/2004 | Hikita et al. |
| 6,806,513 B2 | 10/2004 | Chau et al. |
| 6,906,359 B2 | 6/2005 | Zampardi et al. |
| 7,462,892 B2 | 12/2008 | Hase et al. |
| 9,070,732 B2 | 6/2015 | Zampardi, Jr. et al. |
| 10,056,476 B1 * | 8/2018 | Umemoto ........... H01L 29/7371 |
| 2003/0136956 A1 | 7/2003 | Niwa et al. |
| 2005/0218428 A1 | 10/2005 | Bahl et al. |
| 2007/0001195 A1 | 1/2007 | Shen et al. |
| 2010/0314665 A1 | 12/2010 | Nogome |
| 2015/0255585 A1 | 9/2015 | Chin et al. |

FOREIGN PATENT DOCUMENTS

| | | |
|---|---|---|
| JP | 2004-253823 A | 9/2004 |
| JP | 2006-060221 A | 3/2006 |

* cited by examiner

HETEROJUNCTION BIPOLAR TRANSISTOR

CROSS-REFERENCE TO RELATED APPLICATIONS

This application is a Continuation of U.S. patent application Ser. No. 15/898,440 filed Feb. 17, 2018 and claims benefit of priority to Japanese Patent Application No. 2017-028690 filed Feb. 20, 2017, the entire content of which is incorporated herein by reference.

BACKGROUND

Technical Field

The present disclosure relates to a heterojunction bipolar transistor.

Background Art

In modern mobile terminals, heterojunction bipolar transistors (HBTs) are used as a main transistor in a high-frequency amplifier module. Examples of characteristics generally required of an HBT include high efficiency, high gain, high breakdown voltage, and high output power. In particular, there is a need for increased output power and efficiency in the low-distortion region (linear region).

The maximum output power at which an HBT can operate while maintaining linear input and output characteristics (conditions under which the adjacent channel power ratio (ACPR) is equal to or lower than a reference value, such as about −40 dBc) is herein referred to as "linear output power," and the efficiency of an HBT in operation at the maximum output power at which it can operate while maintaining linear input and output characteristics is referred to as "linear efficiency." There is a demand for increased linear output power and linear efficiency.

Japanese Unexamined Patent Application Publication No. 2000-332023 discloses an HBT with which high operation efficiency can be achieved. In this HBT, a collector layer is formed of AlGaAs and includes a layer in which the AlAs mixed-crystal ratio increases from 0 to 0.2 with increasing distance from a base layer and a layer in which the AlAs mixed-crystal ratio then decreases from 0.2 to 0. At the interface between the two graded layers is a two-dimensional doped layer. The two-dimensional doped layer compensates for a quasi-electric field resulting from the difference in electron affinity and energy band gap between the base layer and the collector layer. Such a structure allows electrons to pass through the base layer and collector layer without encountering a potential barrier.

In the HBT disclosed in Japanese Unexamined Patent Application Publication No. 2000-332023, the maximum of the AlAs mixed-crystal ratio in the AlGaAs collector layer is set to 0.2. The AlAs mixed-crystal ratio is set to 0.2 in order to ensure that the difference in energy level at the upper edge of the valence band is large between the base layer and the collector layer. This leads to advantages of the double heterostructure of the HBT, such as reduced offset voltage and a smaller base-collector capacitance in the saturation region.

Japanese Unexamined Patent Application Publication No. 2006-60221 discloses an HBT with improved output characteristics. This HBT has a first collector layer, a second collector layer, and a third collector layer, from the subcollector layer side to the base layer side. The dopant concentration of the first collector layer is higher than the dopant concentration of the second collector layer, and the dopant concentration of the second collector layer is higher than the dopant concentration of the third collector layer. Inserting the heavily doped first collector layer near a subcollector layer and thereby weakening the electric field at the junction of the second collector layer and the subcollector layer leads to improved on-state breakdown voltage. As a result, an improvement in the resistance to large voltage swings, which is essential for the betterment of output characteristics, is achieved.

In the HBT disclosed in Japanese Unexamined Patent Application Publication No. 2000-332023, the dopant concentration of the collector layer is approximately $2 \times 10^{16}$ $cm^{-3}$. The in-plane dopant concentration of the two-dimensional dope layer, a layer disposed in the collector layer, is approximately $4.8 \times 10^{11}$ $cm^{-2}$. This heavy doping of the collector layer results in a large base-collector voltage dependence of the base-collector capacitance and, therefore, low linear efficiency.

In the HBT disclosed in Japanese Unexamined Patent Application Publication No. 2006-60221, the dopant concentration of the third collector layer, the layer closest to the base layer, is set within the range of $0.5 \times 10^{16}$ $cm^{-3}$ to $4 \times 10^{16}$ $cm^{-3}$. Setting the dopant concentration of the third collector layer to as low as $0.5 \times 10^{16}$ $cm^{-3}$ would ensure little base-collector voltage dependence of the base-collector capacitance and, therefore, high linear efficiency.

However, setting the dopant concentration of the third collector layer low would cause the electric field strength in the collector layer close to the base layer to be small because of the Kirk effect, which becomes apparent in the high-current region (high-output-power region). As a result, the electron velocity would slow down in the high-output-power region, affecting the cutoff frequency. In other words, the linear output power would be reduced in a region in which the operating frequency is high. It would therefore be difficult to give this HBT high linear output power.

SUMMARY

Accordingly, the present disclosure provides a heterojunction bipolar transistor capable of maintaining high linear efficiency and high linear output power.

According to preferred embodiments of a first aspect of the present disclosure, a heterojunction bipolar transistor includes a substrate and a multilayer structure on the substrate, the multilayer structure including a collector layer, a p-type base layer, and an n-type emitter layer. The collector layer includes a high-concentration collector layer and a low-concentration collector layer between the base layer and the high-concentration collector layer, the low-concentration collector layer having a lower dopant concentration than the high-concentration collector layer does. The low-concentration collector layer includes a graded collector layer in which the energy band gap varies to narrow with increasing distance from the base layer. The electron affinity of the semiconductor material for the base layer is greater than the electron affinity of the semiconductor material for the graded collector layer at the point of the largest energy band gap by about 0.15 eV or less. The graded collector layer is formed of a semiconductor material in which electron velocity peaks at a certain electric field strength when the electric field strength is varied. The strength of the quasi-electric field in the graded collector layer, an electric field that acts on electrons as a result of the varying energy band gap, is about 0.3 or more times and about 1.8 or less times (i.e., from about 0.3 times to about 1.8 times) the peak electric field strength, the electric field strength at which the electron velocity peaks.

The low-concentration collector layer reduces the base-collector voltage dependence of the base-collector capacity, improving the linear efficiency. A graded collector layer that meets the above electron-affinity requirement mitigates the blocking effect, i.e., the inhibition of electron transport by a potential barrier existing in the collector layer. Moreover, a graded collector layer that meets the above quasi-electric field requirement reduces the decrease in electron velocity that occurs in the presence of the Kirk effect. Because of these, the decrease in cutoff frequency that occurs in the high-current region is reduced, and, as a result, the loss of linear output power is limited.

According to preferred embodiments of a second aspect of the present disclosure, a heterojunction bipolar transistor has the structure of a heterojunction bipolar transistor according to the first aspect, and, in addition to this, the electron affinity of the semiconductor material for the base layer is greater than the electron affinity of the semiconductor material for the graded collector layer at the point of the largest energy band gap by about 0.09 eV or less.

A graded collector layer that meets the above electron affinity requirement is more effective in mitigating the blocking effect against electron transport. Providing such a layer therefore leads to a further reduction in the decrease in cutoff frequency that occurs in the high-current region and, as a result, more effective limitation to the loss of linear output power.

According to preferred embodiments of a third aspect of the present disclosure, a heterojunction bipolar transistor has the structure of a heterojunction bipolar transistor according to the first or second aspect, and, in addition to this, the strength of the quasi-electric field in the graded collector layer is about 0.5 times or more and about 1.3 times or less (i.e., from about 0.5 times to about 1.3 times) the peak electric field strength.

A graded collector layer that meets the above quasi-electric field requirement is more effective in reducing the decrease in electron velocity that occurs in the presence of the Kirk effect. Providing such a layer therefore further reduces the decrease in cutoff frequency that occurs in the high-current region, leading to more effective limitation to the loss of linear output power.

According to preferred embodiments of a fourth aspect of the present disclosure, a heterojunction bipolar transistor has the structure of a heterojunction bipolar transistor according to any one of the first to third aspects, and, in addition to this, the low-concentration collector layer is an n-type semiconductor layer with an n-type dopant concentration of about $3 \times 10^{15}$ cm$^{-3}$ or less, a p-type semiconductor layer with a p-type dopant concentration of about $1 \times 10^{15}$ cm$^{-3}$ or less, or an intrinsic semiconductor layer. Setting the dopant concentration of the low-concentration collector layer as such leads to a further increase in linear efficiency.

According to preferred embodiments of a fifth aspect of the present disclosure, a heterojunction bipolar transistor has the structure of a heterojunction bipolar transistor according to any one of the first to fourth aspects, and, in addition to this, the low-concentration collector layer includes, besides the graded collector layer, a semiconductor layer in which the energy band gap is constant.

This ensures that even if the thickness of the low-concentration collector layer is optimized to increase the linear efficiency, the thickness of the graded collector layer can be set thinner than that of the low-concentration collector layer without being restricted by the thickness of the low-concentration collector layer. The increased degree of freedom in the selection of the thickness of the graded collector layer allows the manufacturer to suitably modify the strength of the quasi-electric field in the graded collector layer. As a result, the decrease in electron velocity that occurs in the presence of the Kirk effect is reduced more effectively, and higher linear output power is accomplished.

According to preferred embodiments of a sixth aspect of the present disclosure, a heterojunction bipolar transistor has the structure of a heterojunction bipolar transistor according to the first to fifth aspects, and, in addition this, the base layer is formed of GaAs, the graded collector layer is formed of AlGaAs, and the AlAs mixed-crystal ratio decreases with increasing distance from the base layer.

This allows, in the fabrication of a heterojunction bipolar transistor that meets the electron affinity, quasi-electric field, and dopant concentration requirements, etc., according to any one of the first to fifth aspects, the manufacturer to maintain the production yield high by utilizing the mature crystal-growth technology for the AlGaAs series. Moreover, the production process does not become complicated and the costs are not increased since a common process for producing a known heterojunction bipolar transistor can be applied.

According to preferred embodiments of a seventh aspect of the present disclosure, a heterojunction bipolar transistor has the structure of a heterojunction bipolar transistor according to the sixth aspect, and, in addition to this, the AlAs mixed-crystal ratio in the graded collector layer at the interface on the base layer side is about 0.025 or more and about 0.125 or less (i.e., from about 0.025 to about 0.125).

When the AlAs mixed-crystal ratio is set within the above range, the electron affinity-related requirement imposed on the heterojunction bipolar transistor according to the first aspect is met. This reduces the decrease in electron velocity that occurs in the presence of the Kirk effect, and brings down the decrease in cutoff frequency that occurs in the high-current region. As a result, the loss of linear output power is limited.

According to preferred embodiments of an eighth aspect of the present disclosure, a heterojunction bipolar transistor has the structure of a heterojunction bipolar transistor according to any one of the first to seventh aspects, and, in addition to this, further has an n-type subcollector layer on the substrate. The collector layer, base layer, and emitter layer are stacked in this order on part of the surface region of the subcollector layer, and the high-concentration collector layer includes a first layer on the subcollector layer side and a second layer on the low-concentration collector layer side. The dopant concentration of the first layer and the dopant concentration of the subcollector layer are higher than the dopant concentration of the second layer.

The first layer is inserted to be parallel with the subcollector layer in the path of collector current. This reduces the collector resistance, making progress in increasing the output power and improving the efficiency of power amplifiers equipped with a heterojunction bipolar transistor.

According to preferred embodiments of a ninth aspect of the present disclosure, a heterojunction bipolar transistor has the structure of a heterojunction bipolar transistor according to the eighth aspect, and, in addition to this, the dopant concentration of the second layer and the dopant concentration of the low-concentration collector layer are equal to or less than about $\frac{1}{10}$ of the dopant concentration of the first layer.

This prevents a decrease in base-collector breakdown voltage and collector-emitter breakdown voltage, thereby preventing the breakdown of the heterojunction bipolar transistor that would otherwise occur when the output voltage swings to a maximum extent at full high-frequency output power.

According to preferred embodiments of a tenth aspect of the present disclosure, a heterojunction bipolar transistor has the structure of a heterojunction bipolar transistor according to any one of the first to ninth aspects, and, in addition to this, the low-concentration collector layer includes a reversely graded collector layer between the graded collector layer and the base layer, the energy band gap of the reversely graded collector layer varies in the thickness direction, the energy band gap of the reversely graded collector layer at the interface on the base layer side is equal to the energy band gap of the base layer, and, at the interface between the graded collector layer and the reversely graded collector layer, the energy band gap of the graded collector layer and the energy band gap of the reversely graded collector layer are equal.

Inserting such a reversely graded collector layer between the graded collector layer and the base layer lowers the potential barrier that acts on the electrons that flow from the base layer into the collector layer in the presence of emitter-collector voltage. This reduces the decrease in the velocity of electrons transported in the collector, limiting the loss of linear output power.

Other features, elements, characteristics and advantages of the present disclosure will become more apparent from the following detailed description of preferred embodiments of the present disclosure with reference to the attached drawings.

DETAILED DESCRIPTION

Before the description of embodiments, the high-frequency characteristics of HBTs according to Reference Configurations 1 and 2, which have a structure similar to that of the HBTs presented in the citation, are described with reference to FIGS. 10A, 10B, and 11. To evaluate the high-frequency characteristics, the inventors determined the relationship of cutoff frequency, which provides a measure of high-frequency characteristics, and collector current by simulation.

Figure 10A:
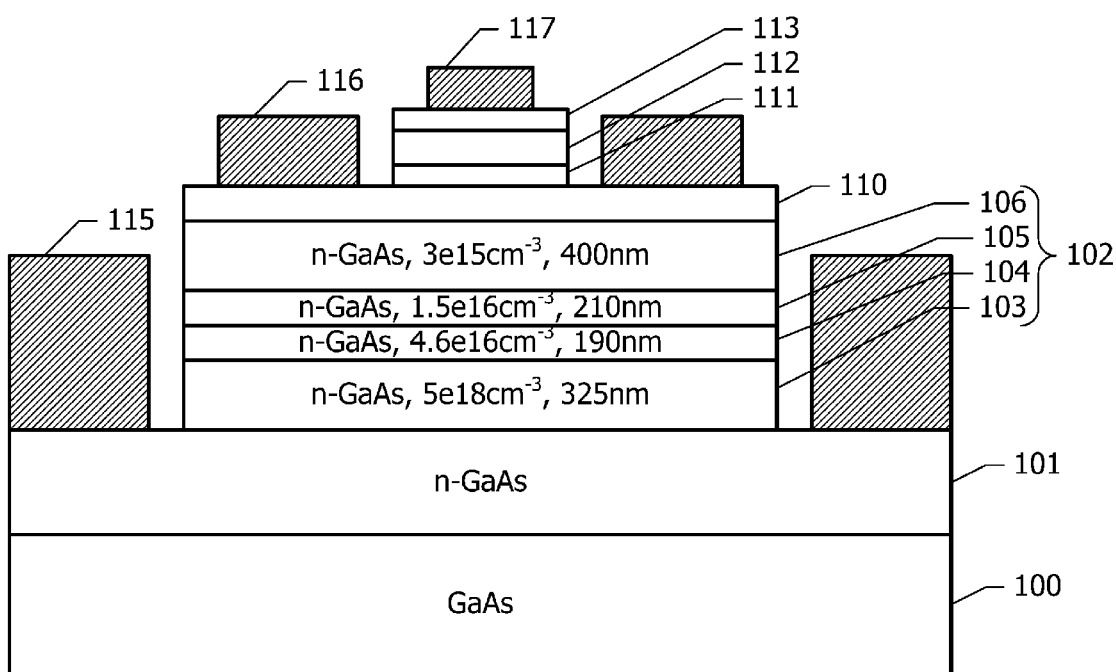
FIG. 10A is a schematic cross-sectional view of an HBT according to Reference Configuration 1.

FIG. 10A is a schematic cross-sectional view of an HBT according to Reference Configuration 1. There is an n-type GaAs subcollector layer 101 on a semi-insulating GaAs substrate 100. An n-type GaAs collector layer 102 and a p-type GaAs base layer 110 are stacked in this order on part of the surface region of the subcollector layer 101. An n-type InGaP emitter layer 111, a cap layer 112, and a contact layer 113 are stacked in this order on part of the surface region of the base layer 110.

A collector electrode 115 is ohmically coupled to the subcollector layer 101. A base electrode 116 is ohmically coupled to the base layer 110. An emitter electrode 117 is ohmically coupled to the emitter layer 111 with the contact layer 113 and cap layer 112 interposed therebetween.

The collector layer 102 has a multilayer structure in which, in order from the substrate 100 side, a first collector layer 103, a second collector layer 104, a third collector layer 105, and a fourth collector layer 106 are stacked. The first collector layer 103 has a dopant concentration of about $5\times10^{18}$ cm$^{-3}$ and a thickness of about 325 nm. The second collector layer 104 has a dopant concentration of about $4.6\times10^{16}$ cm$^{-3}$ and a thickness of about 190 nm. The third collector layer 105 has a dopant concentration of about $1.5\times10^{16}$ cm$^{-3}$ and a thickness of about 210 nm. The fourth collector layer 106 has a dopant concentration of about $3\times10^{15}$ cm$^{-3}$ and a thickness of about 400 nm.

In the HBT according to Reference Configuration 1, the dopant concentration of the collector layer 102 is relatively low on the base layer 110 side and relatively high on the subcollector layer 101 side. This distribution of dopant concentrations is similar to the distribution of dopant concentrations in the collector layers of the HBT disclosed in Japanese Unexamined Patent Application Publication No. 2006-60221.

Figure 10B:
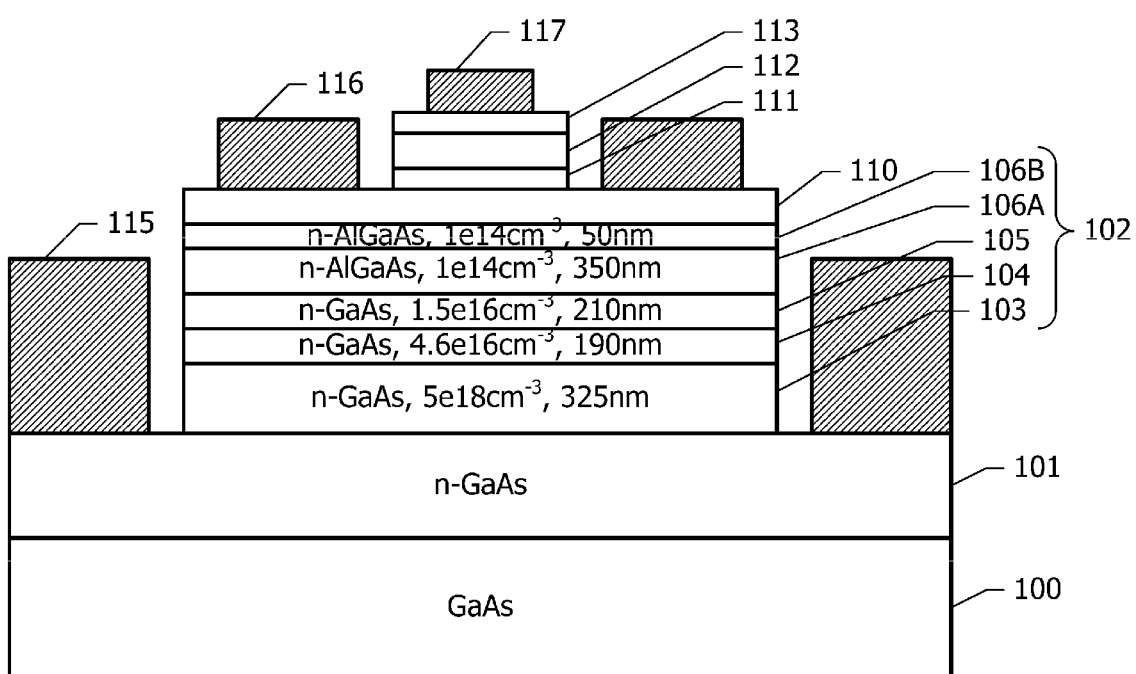
FIG. 10B is a schematic cross-sectional view of an HBT according to Reference Configuration 2.

FIG. 10B is a schematic cross-sectional view of an HBT according to Reference Configuration 2. In an HBT according to Reference Configuration 2, the fourth collector layer 106 in an HBT according to Reference Configuration 1 is composed of a graded collector layer 106A, on the lower side, and a reversely graded collector layer 106B, on the upper side. The dopant concentrations of the graded collector layer 106A, on the lower side, and the reversely graded collector layer 106B, on the upper side, are both about $1\times10^{14}$ cm$^{-3}$, set to be lower than the dopant concentration of the fourth collector layer 106 in Reference Configuration 1 for higher linear efficiency. The rest of the structure of the HBT according to Reference Configuration 2 is the same as in the structure of the HBT according to Reference Configuration 1.

The graded collector layer 106A and reversely graded collector layer 106B are formed of n-type AlGaAs. The AlAs mixed-crystal ratio in AlGaAs is represented by x. The AlAs mixed-crystal ratio x refers to the relative number of moles of AlAs in a mixed crystal composed of GaAs and AlAs. For example, an AlGaAs mixed crystal with an AlAs mixed-crystal ratio of x is described as $AlGa_{1-x}As$. The AlAs mixed-crystal ratio x in the reversely graded collector layer 106B is about 0 at the interface with the base layer 110, and about 0.2 at the interface with the graded collector layer 106A, on the lower side. The AlAs mixed-crystal ratio x in the graded collector layer 106A is about 0.2 at the interface with the reversely graded collector layer 106B, on the upper side, and about 0 at the interface with the third collector layer 105. Inside the graded collector layer 106A and reversely graded collector layer 106B, the AlAs mixed-crystal ratio x varies linearly in the thickness direction.

The HBT according to Reference Configuration 2 is structurally similar to the HBT disclosed in Japanese Unexamined Patent Application Publication No. 2000-332023 in that it has a graded collector layer 106A and a reversely graded collector layer 106B in which the AlAs mixed-crystal ratio x varies in the thickness direction. Moreover, the distribution of dopant concentrations in the collector layer 102 of the HBT according to Reference Configuration 2 is similar to the distribution of dopant concentrations in the collector layers of the HBT disclosed in Japanese Unexamined Patent Application Publication No. 2006-60221 in that the dopant concentration is relatively low on the base layer 110 side and relatively high on the subcollector layer 101 side. That is, the HBT according to Reference Configuration 2 has both of a feature of the HBT disclosed in Japanese Unexamined Patent Application Publication No. 2000-332023 and a feature of the HBT disclosed in Japanese Unexamined Patent Application Publication No. 2006-60221.

For an HBT according to Reference Configuration 1 (FIG. 10A) and an HBT according to Reference Configuration 2 (FIG. 10B), the relationship between cutoff frequency and collector current was determined by simulation. The following describes the results of the simulations.

Figure 11:
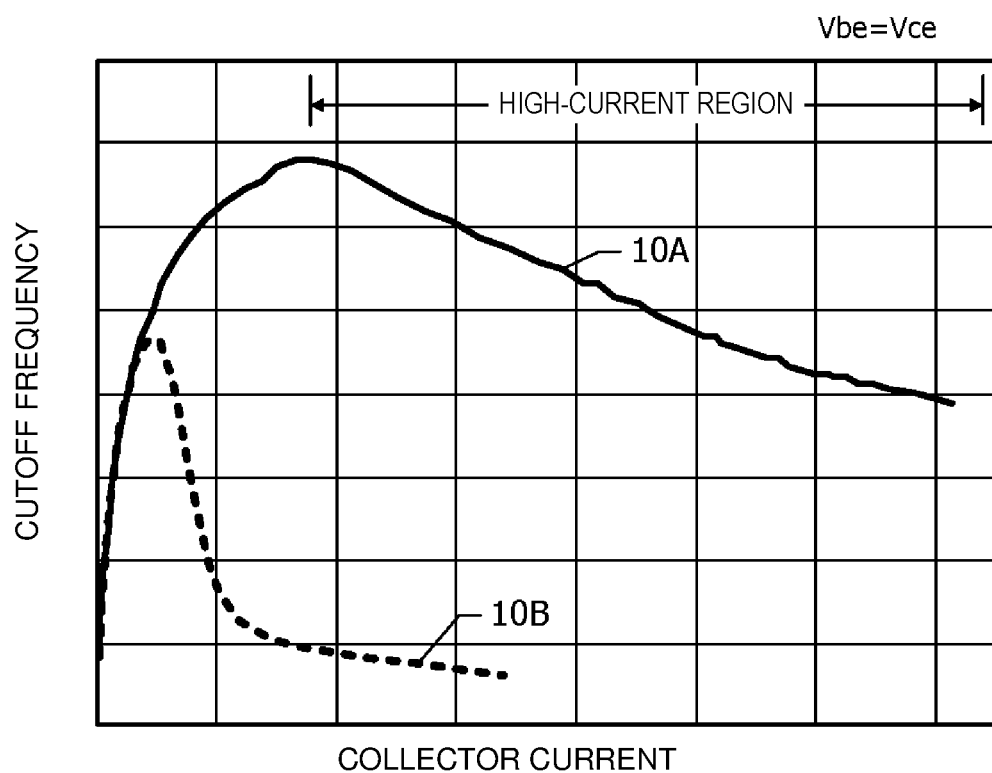
FIG. 11 is a graph that shows a simulated relationship between the cutoff frequency and collector current of an HBT.

FIG. 11 is a graph that shows a simulated relationship between cutoff frequency and collector current. The horizontal axis represents the magnitude of collector current, and the vertical axis represents cutoff frequency. The solid line 10A in the graph indicates the cutoff frequency of the HBT according to Reference Configuration 1 (FIG. 10A), and the broken line 10B indicates the cutoff frequency of the HBT according to Reference Configuration 2 (FIG. 10B). Note that FIG. 11 shows the cutoff frequencies in and near the saturation region, which plays an important role in increasing output power, of the HBTs. The simulations were performed under conditions such that the base-emitter voltage and the collector-emitter voltage would be equal.

It can be seen that in Reference Configuration 1, as shown with the solid line 10A, the cutoff frequency decreases with increasing collector current in the high-current region, which is necessary for increasing output power. The following discusses the cause of the decrease in cutoff frequency.

As the collector current increases, the charge of electrons running in the collector layer 102 (FIG. 10A) becomes not negligible for the space charge, for example of donors, changing the shape of the potential of the collector. The electric field of the region in the collector layer 102 closer to the base layer 110 decreases, slowing down the electron velocity. The resulting increase in base-collector diffusion capacitance and the subsequent increase in the transit time of electrons passing through the region in the collector layer 102 closer to the base layer 110 affect the cutoff frequency. Such an effect is referred to as Kirk effect.

When the dopant concentration is set low on the base layer 110 side of the collector layer 102 as in Reference Configuration 1, it is difficult to maintain the cutoff frequency high in the high-current region because of the influence of the Kirk effect.

It can be seen that in Reference Configuration 2, as shown with the broken line 10B, the cutoff frequency markedly decreases in the high-current region. The following discusses the cause of the decrease in cutoff frequency.

In Reference Configuration 2, the electron affinity of the AlGaAs reversely graded collector layer 106B and graded collector layer 106A (FIG. 10B) is smaller than the electron affinity of the GaAs base layer 110 (FIG. 10B). The energy level of electrons at the lower edge of the conduction band of the graded collector layer 106A and reversely graded collector layer 106B is therefore higher than the energy level of electrons at the lower edge of the conduction band of the base layer 110. In particular, the interface between the reversely graded collector layer 106B and the graded collector layer 106A works as a potential barrier against electrons transported in the collector layer 102 because the AlAs mixed-crystal ratio is the highest at this interface. This effect whereby a potential barrier inhibits electron transport is referred to as blocking effect.

In Reference Configuration 2, the blocking effect is significant because of low dopant concentrations of the graded collector layer 106A and reversely graded collector layer 106B. In particular, in the high-current region, the charge of electrons running in the collector layer 102 (FIG. 10A) is not negligible for the space charge, for example of donors, and the blocking effect is more significant. As a result, the cutoff frequency is markedly low in the high-current region. It is therefore difficult to accomplish high linear output power.

To mitigate the blocking effect, the manufacturer can set the dopant concentration high on the base layer side of the collector layer or provide a two-dimensional doped layer as in the HBT disclosed in Japanese Unexamined Patent Application Publication No. 2000-332023. In such a configuration, however, the linear efficiency is low because of large base-collector voltage dependence of the base-collector capacitance.

As seen from the foregoing, it is difficult to achieve high linear efficiency and high linear output power at the same time with the existing approach of reducing concentrations in the collector layer or introducing a graded collector layer. In contrast, the embodiments described below accomplish both of high linear efficiency and high linear output power.

Embodiment 1

The following describes an HBT according to Embodiment 1 with reference to FIG. 1A to FIG. 6.

Figure 1A:
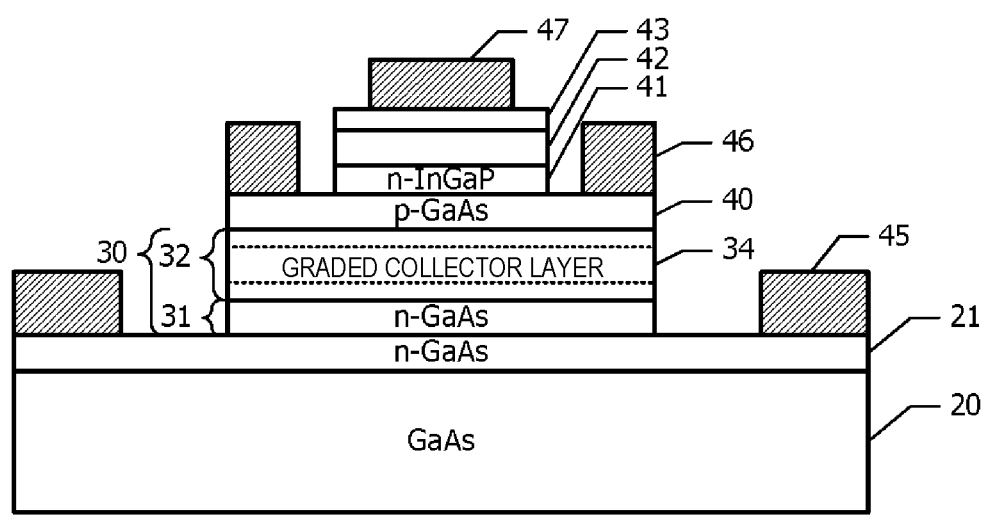
FIG. 1A is a schematic cross-sectional view of an HBT according to Embodiment 1.

FIG. 1A is a schematic cross-sectional view of an HBT according to Embodiment 1. There is an n-type GaAs subcollector layer 21 on a GaAs substrate 20. A collector layer 30 and a p-type GaAs base layer 40 are stacked in this order on part of the surface region of the subcollector layer 21.

The collector layer 30 includes a high-concentration collector layer 31 and a low-concentration collector layer 32. The low-concentration collector layer 32 is disposed between the high-concentration collector layer 31 and the base layer 40. The dopant concentration of the low-concentration collector layer 32 is lower than the dopant concentration of the high-concentration collector layer 31. FIG. 1A illustrates an example in which the high-concentration collector layer 31 is in contact with the subcollector layer 21, and the low-concentration collector layer 32 is in contact with the base layer 40. It should be understood that the high-concentration collector layer 31 does not need to be in direct contact with the subcollector layer 21, the low-concentration collector layer 32 does not need to be in direct contact with the base layer 40, and there may be another layer between the low-concentration collector layer 32 and the base layer 40.

Part or the entirety in the thickness direction of the low-concentration collector layer 32 is a graded collector layer 34 made of n-type AlGaAs. The graded collector layer 34 is formed of a mixed-crystal semiconductor different from the semiconductors that form the subcollector layer 21 and the base layer 40, and has mixed-crystal ratios varying (graded) in the thickness direction. The mixed-crystal ratio varies so that the energy band gap tapers from the base layer 40 side to subcollector layer 21 side. On the substrate 20 side of the low-concentration collector layer 32 with respect to the graded collector layer 34, the mixed-crystal ratio is constant in the thickness direction.

Figure 1B:
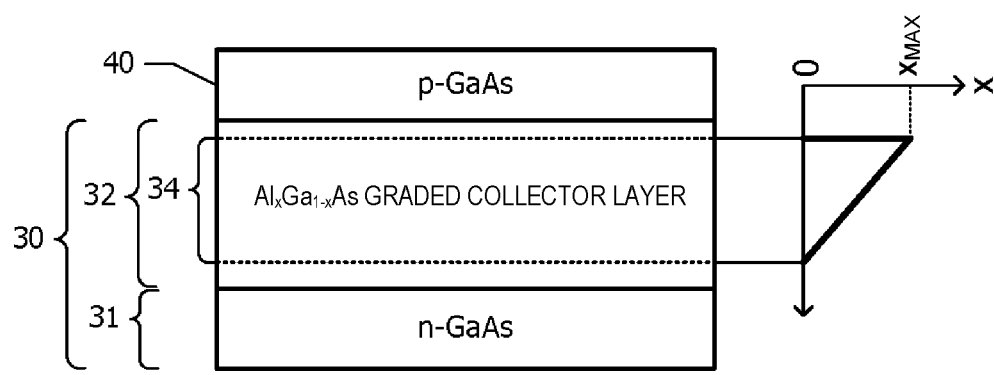
FIG. 1B is a schematic cross-sectional diagram that includes a graph that shows an example of a change in mixed-crystal ratio in a graded collector layer.

FIG. 1B is a schematic cross-sectional diagram that includes a graph that shows an example of a change in the mixed-crystal ratio in the graded collector layer 34. The graded collector layer 34 is formed of n-type $AlGa_{1-x}As$, and the AlAs mixed-crystal ratio x in the graded collector layer 34 tapers from the base layer 40 side to the subcollector layer 21 side. The AlAs mixed-crystal ratio x at the interface on the subcollector layer 21 side is about 0. That is, at the interface of the graded collector layer 34 closest to the subcollector layer 21, the energy band gap of the graded collector layer 34 is equal to the energy band gap of the subcollector layer 21. The AlAs mixed-crystal ratio x at the interface on the base layer 40 side is represented by $x_{MAX}$. This mixed-crystal ratio $x_{MAX}$ is hereinafter referred to as maximum mixed-crystal ratio. The AlAs mixed-crystal ratio x varies linearly in the graded collector layer 34 in the thickness direction.

As illustrated in FIG. 1A, an n-type InGaP emitter layer 41, a cap layer 42, and a contact layer 43 are stacked in this order on part of the surface region of the base layer 40. A collector electrode 45 makes ohmic contact with the subcollector layer 21. A base electrode 46 makes ohmic contact with the base layer 40. An emitter electrode 47 makes ohmic contact with the contact layer 43, ohmically coupling the emitter electrode 47 to the emitter layer 41.

Figure 2:
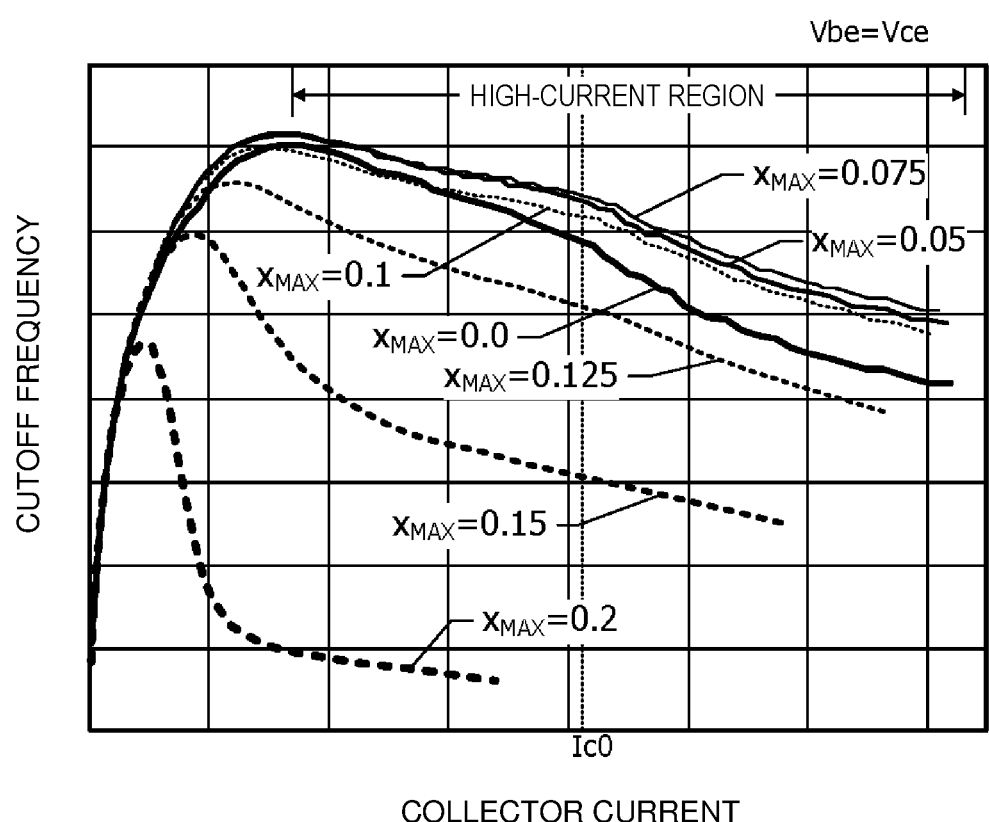
FIG. 2 is a graph that shows a simulated relationship between the magnitude of collector current and cutoff frequency for various maximum mixed-crystal ratios $x_{MAX}$ in the graded collector layer (FIG. 1A) of an HBT according to Embodiment 1.

The following describes how the cutoff frequency varies with maximum mixed-crystal ratio $x_{MAX}$ in the high-current region, with reference to FIG. 2.

FIG. 2 is a graph that shows a simulated relationship between the magnitude of collector current and cutoff frequency for multiple samples of HBTs according to Embodiment 1 with different maximum mixed-crystal ratios $x_{MAX}$ of the graded collector layer 34 (FIG. 1A). Note that although FIG. 2 shows the results of simulations performed on samples having the structure illustrated in FIG. 10B with different maximum mixed-crystal ratios $x_{MAX}$, the structure in FIG. 10B can be deemed to be substantially identical to the structure in FIG. 1A. For example, the graded collector layer 34 in FIG. 1A corresponds to the graded collector layer 106A in FIG. 10B. The high-concentration collector layer 31 in FIG. 1A corresponds to the three layers of the first collector layer 103, second collector layer 104, and third collector layer 105 in FIG. 10B. The layer between the graded collector layer 34 and the base layer 40 in FIG. 1A corresponds to the reversely graded collector layer 106B in FIG. 10B. Simulations were performed on multiple maximum mixed-crystal ratios $x_{MAX}$ between about 0.0 and about 0.2. FIG. 2 shows the behavior of cutoff-frequency determined in and near the saturation region, which plays an important role in increasing output power, of the HBTs. Maximum mixed-crystal ratios $x_{MAX}$ are given corresponding one-to-one to the solid or broken lines in the graph in FIG. 2. Note that the simulations were performed under conditions such that the emitter-base voltage Vbe would be equal to the emitter-collector voltage Vce.

In the high-current region, at maximum mixed-crystal ratios $x_{MAX}$ of about 0 to about 0.075, the cutoff frequency becomes higher with increasing maximum mixed-crystal ratio $x_{MAX}$. At maximum mixed-crystal ratios $x_{MAX}$ of about 0.075 or more and about 0.1 or less (i.e., from about 0.075 to about 0.1), the cutoff frequency decreases with increasing maximum mixed-crystal ratio $x_{MAX}$, but the decrease in cutoff frequency is small. At maximum mixed-crystal ratios $x_{MAX}$ exceeding about 0.1, the decrease in cutoff frequency associated with an increase in maximum mixed-crystal ratio $x_{MAX}$ is large, and at maximum mixed-crystal ratios $x_{MAX}$ exceeding about 0.125, the decrease in cutoff frequency associated with an increase in maximum mixed-crystal ratio $x_{MAX}$ is markedly large. From the simulation results shown in FIG. 2, it can be seen that there is a maximum mixed-crystal ratio $x_{MAX}$ best for reducing the decrease in cutoff frequency (for accomplishing high linear output power) in the high-current region. In the example illustrated in FIG. 2, the best maximum mixed-crystal ratio $x_{MAX}$ is in the vicinity of about 0.075.

The following describes the reason why the relationship between collector current and cutoff frequency varies with maximum mixed-crystal ratio $x_{MAX}$, separately for the case in which the maximum mixed-crystal ratio $x_{MAX}$ is about 0.1 or more and the case in which $x_{MAX}$ is about 0.1 or less.

Maximum Mixed-Crystal Ratio $x_{MAX}$ is about 0.1 or More

At maximum mixed-crystal ratios $x_{MAX}$ of about 0.1 or more, as shown in FIG. 2, the cutoff frequency decreases with increasing maximum mixed-crystal ratio $x_{MAX}$. In particular, at maximum mixed-crystal ratios $x_{MAX}$ of about 0.15 or more, not only the cutoff frequency decreases with increasing maximum mixed-crystal ratio $x_{MAX}$ in the high-current region, but also the peak maximum mixed-crystal ratio $x_{MAX}$ decreases in the low-current region. The decrease in cutoff frequency and the decrease in peak maximum mixed-crystal ratio $x_{MAX}$ result from, as described with reference to FIG. 11, the blocking effect caused by a potential barrier in the collector layer acting on electron transport becoming apparent.

Figure 3:
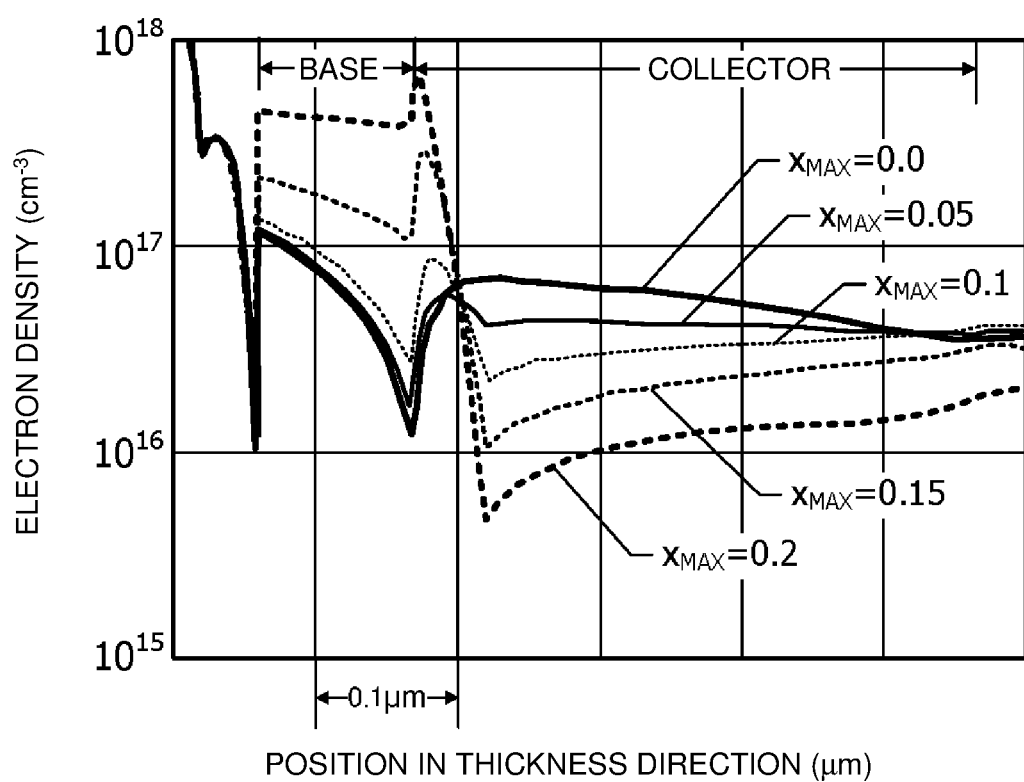
FIG. 3 is a graph that shows a simulated distribution of electron densities in the base layer and collector layer (FIG. 1A)

The following describes the grounds for the belief that the blocking effect is apparent at maximum mixed-crystal ratios $x_{MAX}$ of about 0.1 or more, with reference to FIG. 3.

FIG. 3 is a graph that shows a simulated distribution of electron densities in the base layer 40 and collector layer 30 (FIG. 1A). The horizontal axis represents the position in the thickness direction in the base layer 40 and collector layer 30, with one space corresponding to 0.1 μm. The vertical axis represents electron density in the unit of "$cm^{-3}$." Simulations were performed on multiple maximum mixed-crystal ratios $x_{MAX}$ in the range of about 0.0 to about 0.2.

Maximum mixed-crystal ratios $x_{MAX}$ are given corresponding one-to-one to the solid or broken lines in the graph in FIG. 3. Note that the simulation results shown in FIG. 3 represent electron densities in a state in which a collector current in the high-current region, specifically the collector current Ic0 indicated in FIG. 2, is flowing.

When the maximum mixed-crystal ratio $x_{MAX}$ is about 0.15 or about 0.2, the electron density sharply peaks near the interface between the base layer 40 and the collector layer 30. This indicates that electron transport is being blocked by a potential barrier formed at the point of the largest energy band gap in the graded collector layer 34 (FIG. 1B). The blocked electron transport from the base layer 40 to the collector layer 30 leads to the accumulation of electrons and therefore increased electron density in the base layer 40, resulting in an increase in emitter diffusion capacitance Cbe. The increase in emitter diffusion capacitance Cbe leads to a decrease in cutoff frequency as shown in FIG. 2.

When the maximum mixed-crystal ratio $x_{MAX}$ is about 0.0, no blocking effect occurs since no potential barrier is formed against electrons. The electron density in the base layer 40 at a maximum mixed-crystal ratio $x_{MAX}$ of about 0.05 is substantially equal to the electron density at a maximum mixed-crystal ratio $x_{MAX}$ of about 0.0. This means that when the maximum mixed-crystal ratio $x_{MAX}$ is about 0.05, the blocking effect is substantially absent, and therefore the decrease in cutoff frequency is limited as shown in FIG. 2.

The increase in electron density in the base layer 40 is slight even when the maximum mixed-crystal ratio $x_{MAX}$ is increased to about 0.1, indicating controlled influence of the blocking effect. The difference between the electron affinity of an AlGaAs with an AlAs mixed-crystal ratio of about 0.1 and the electron affinity of GaAs is about 0.12 eV. It is therefore preferred to select the semiconductor material for the base layer 40 and the semiconductor material for and the maximum mixed-crystal ratio $x_{MAX}$ in the graded collector layer 34 to meet the first and second requirements below so that the influence of the blocking effect will be controlled.

The first requirement can be that the electron affinity of the semiconductor material that forms the base layer 40 be greater than the electron affinity of a semiconductor material that has the composition that the graded collector layer 34 has in the peak portion, the portion in which the lower edge of the conduction band of the layer is the highest (the point at which the energy band gap is the largest). The second requirement can be that the difference in electron affinity between the two semiconductor materials be about 0.12 eV or less.

Moreover, as can be seen from FIG. 2, the cutoff frequency is the highest in the high-current region when the maximum mixed-crystal ratio $x_{MAX}$ is about 0.075. The difference between the electron affinity of an AlGaAs with an AlAs mixed-crystal ratio x of about 0.075 and the electron affinity of GaAs is about 0.09 eV. It is therefore more preferred to replace the second requirement with the requirement that the difference in electron affinity between the two semiconductor materials be about 0.09 eV or less.

Furthermore, as can be seen from FIG. 2, the cutoff frequency is not markedly low in the high-current region when the maximum mixed-crystal ratio $x_{MAX}$ is about 0.125, either. The difference between the electron affinity of an AlGaAs with an AlAs mixed-crystal ratio x of about 0.125 and the electron affinity of GaAs is about 0.15 eV. The second requirement may therefore be replaced with the requirement that the difference in electron affinity between the two semiconductor materials be about 0.15 eV or less.

Maximum Mixed-Crystal Ratios $x_{MAX}$ is about 0 or More and about 0.1 or Less (i.e., from about 0 to about 0.1)

The electric field in the fourth collector layer 106 (FIG. 10A), a low-concentration collector layer, becomes small in the high-current region because of the Kirk effect. In the fourth collector layer 106, therefore, whereas diffusion current contributes greatly to the collector current, drift current contributes little. Electrons accumulate in the fourth collector layer 106 to such a density that the stream of electrons flowing from the base layer 110 (FIG. 10A) into the fourth collector layer 106 is maintained, increasing the base-collector diffusion capacitance and the transit time of electrons in the collector layer. As a result, as shown in FIG. 2 with the $x_{MAX}$=0.0 solid line, the cutoff frequency decreases with increasing collector current in the region in which the current is higher than the collector current at which the cutoff frequency peaks. As is clear from this, the decrease in cutoff frequency with increasing collector current in the high-current region is a result of the Kirk effect.

The inventors for the present application found that even in the high-current region, in which the Kirk effect occurs, the effective electric field in the low-concentration collector layer 32 can be controlled by adjusting the energy band gap of the graded collector layer 34 (FIGS. 1A and 1B). The following demonstrates, on the basis of simulation results, that the effective electric field in the low-concentration collector layer 32 can be controlled, with reference to FIG. 4.

Figure 4:
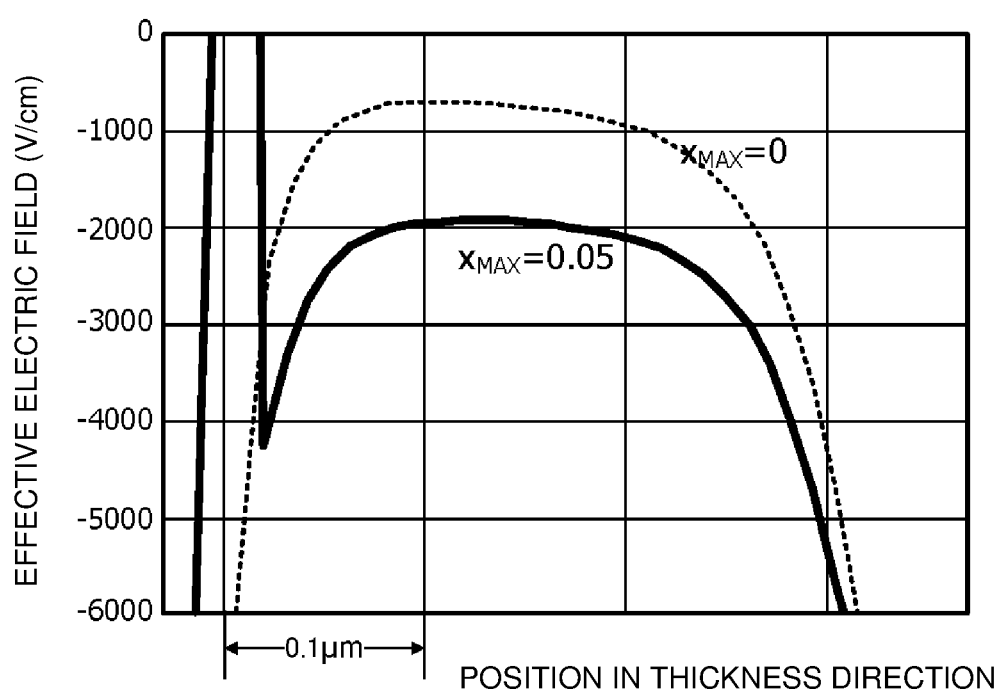
FIG. 4 is a graph that shows simulated effective electric fields in a low-concentration collector layer.

FIG. 4 is a graph that shows simulated effective electric fields in the low-concentration collector layer 32. The horizontal axis represents the position in the thickness direction, with one space corresponding to 0.1 μm. The vertical axis represents effective electric field in the unit of "V/cm." An effective electric field directed from the emitter layer 41 to the collector layer 30 (FIG. 1A) was defined as positive. The simulation results shown in FIG. 4 represent effective electric fields in a state in which a collector current in the high-current region, specifically the collector current Ic0 indicated in FIG. 2, is flowing.

The structures of the simulated HBTs are identical to those illustrated in FIGS. 10A and 10B. The broken line in the graph in FIG. 4 indicates effective electric fields simulated for an HBT illustrated in FIG. 10A (maximum mixed-crystal ratio $x_{MAX}$=about 0.0), and the solid line indicates effective electric fields simulated for an HBT illustrated in FIG. 10B (maximum mixed-crystal ratio $x_{MAX}$=about 0.05). The region in which the effective electric field is positive corresponds to the reversely graded collector layer 106B illustrated in FIG. 10B.

The effective electric field can be separated into a component resulting from electrostatic potential (hereinafter referred to as "external electric field") and a component resulting from the tapering energy band gap of the graded collector layer 106A (FIG. 10B) (hereinafter referred to as "quasi-electric field"). The quasi-electric field can be further separated into a component due to a gradient in the energy level of the lower edge of the conduction band and a component due to a gradient in the effective density of states in the conduction band.

In the HBT with $x_{MAX}$=about 0.0 in FIG. 4, there is no quasi-electric field. Therefore, the effective electric field is totally the external electric field. In the HBT with $x_{MAX}$=about 0.05, which includes the graded collector layer 106A, the effective electric field is equal to the sum of the external electric field and the quasi-electric field. It can be seen that providing the graded collector layer 106A makes the absolute effective electric field great as compared with that in the HBT in FIG. 10A, which has no graded collector layer. The difference in effective electric field between the two HBTs is roughly between 1000 V/cm and 1400 V/cm. It can also be seen that in the region in which the absolute effective electric field is the smallest, giving a gradient to the energy band gap of the low-concentration collector layer 32 leads to an about twofold increase in absolute effective electric field.

In the region in which the current is low enough that the Kirk effect is not apparent, the external electric field is predominant in the graded collector layer 106A, and the quasi-electric field is negligibly small compared with the external electric field. In the high-current region, the quasi-electric field is unignorably large in relation to the external electric field because the effective electric field in the graded collector layer 106A is small as a result of the Kirk effect being apparent. The advantage of providing the graded collector layer 106A is particularly great in the high-current region, in which the Kirk effect is apparent.

In the foregoing, it has been shown that providing a graded collector layer 106A increases the absolute effective electric field. This increase in effective electric field varies as the maximum mixed-crystal ratio $x_{MAX}$ in the graded collector layer 106A is adjusted. The following describes a preferred range of effective electric fields for increasing the linear output power by reducing the decrease in cutoff frequency and a preferred range of maximum mixed-crystal ratios $x_{MAX}$, with reference to FIGS. 5A and 5B.

Figure 5A:
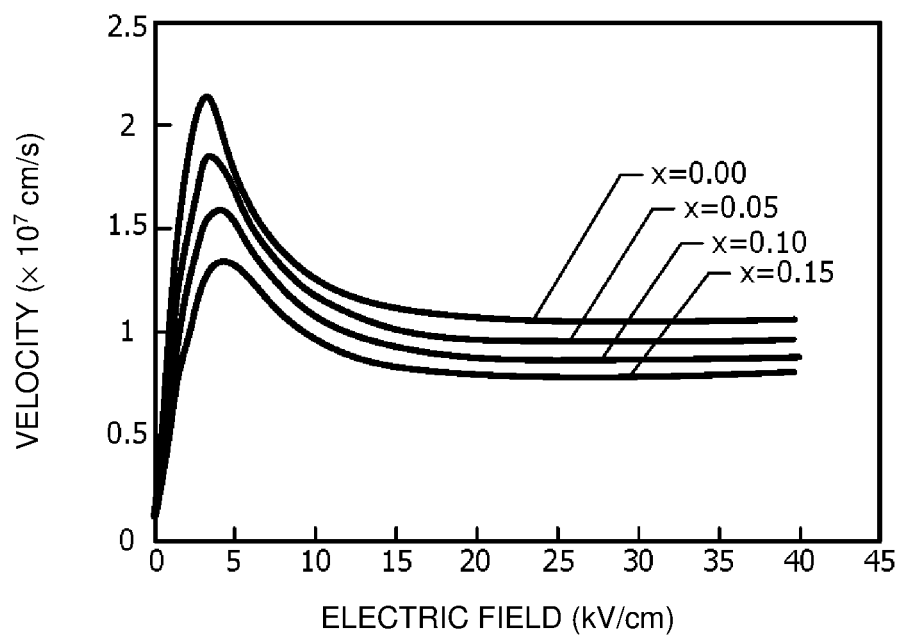
FIGS. 5A and 5B are graphs that show the relationship between electric field strength and electron velocity in an AlGaAs layer.
Figure 5B:
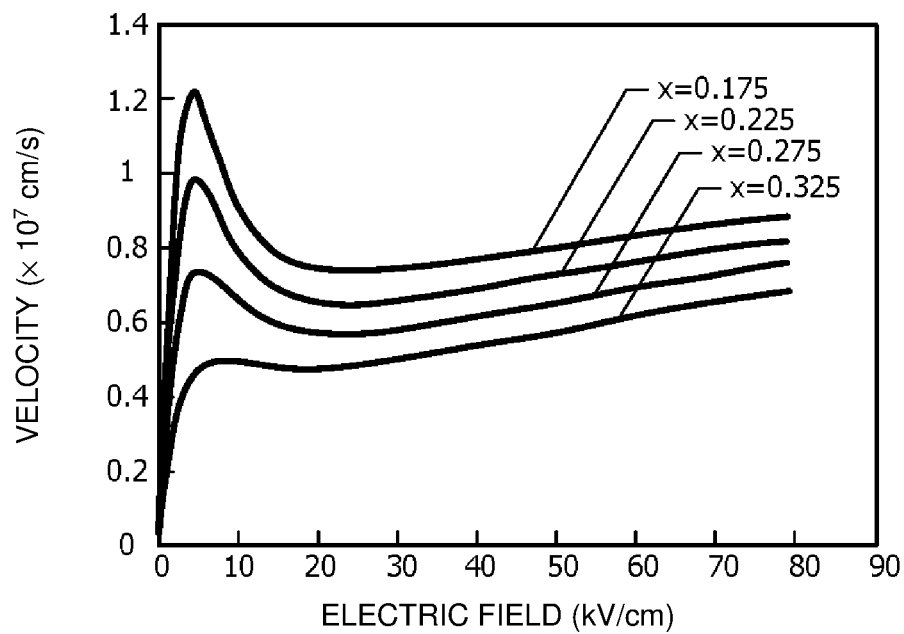

FIGS. 5A and 5B are graphs that show the relationship between electric field strength and electron velocity in an AlGaAs layer. These graphs have been published in Journal of Applied Physics, vol. 87, p. 2890 (2000) by S. Hava and M. Auslender. The horizontal axis in FIGS. 5A and 5B represents electric field strength in the unit of "kV/cm," and the vertical axis represents electron velocity in the unit of "×10$^7$ cm/s." The numeric values paired with the curves in the graphs in FIGS. 5A and 5B indicate AlAs mixed-crystal ratios.

It can be seen that AlGaAs is a material in which the electron velocity peaks at a certain electric field strength when the electric field strength is varied. Within the range of AlAs mixed-crystal ratios of about 0.0 or more and about 0.1 or less (i.e., from about 0.0 to about 0.1), the electron velocity is the maximum at an electric field strength of approximately 3400 V/cm. The electric field strength at which the electron velocity peaks is hereinafter referred to as "peak electric field strength."

Operating the HBT under conditions such that the effective electric field in the low-concentration collector layer 32 (FIG. 1A) comes near the peak electric field strength accelerates electrons in the low-concentration collector layer 32, reducing the decrease in cutoff frequency that occurs in the high-current region. When the strength of the effective electric field falls within the range of about 0.5 or more times to about 2 or less times (i.e., from about 0.5 times to about 2 times) the peak electric field strength, an electron velocity equal to or higher than about 70% of the peak value is achieved. When the strength of the effective electric field falls within the range of about 0.7 or more times to about 1.5 or less times (i.e., from about 0.7 times to about 1.5 times) the peak electric field strength, an electron velocity equal to or higher than about 90% of the peak value is achieved. As is clear from this, setting the strength of the effective electric field within the above ranges will ensure that the electron velocity remains high, resulting in a smaller decrease in cutoff frequency.

The effective electric field, as already described, is defined as the sum of the external electric field and the quasi-electric field. It was determined by simulation that at collector-emitter voltages in and near the saturation region, which plays an important role for increasing output power, of an HBT, the contribution of the external electric field to the effective electric field is approximately 700 V/cm. The preferred range of quasi-electric fields for maintaining the electron velocity high can be determined by subtracting the strength of the external electric field from the strength of the effective electric field. Subtracting the strength of the external electric field from the strength of the effective electric field gives the result that to make the electron velocity equal to or higher than about 70% of the peak value, it is recommended to set the strength of the quasi-electric field about 0.3 or more times and about 1.8 or less times (i.e., from about 0.3 times to about 1.8 times) the peak electric field strength. To make the electron velocity equal to or higher than about 90% of the peak value, it is recommended to set the strength of the quasi-electric field about 0.5 or more times and about 1.3 or less times (i.e., from about 0.5 times to about 1.3 times).

Figure 6:
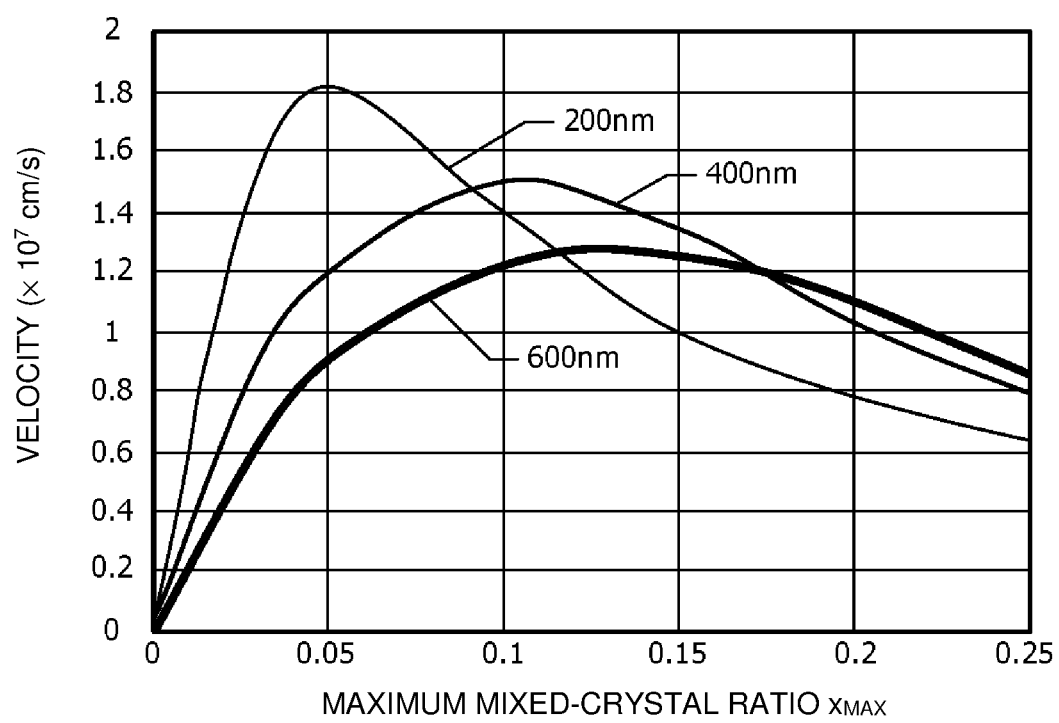
FIG. 6 is a graph that shows a simulated relationship between maximum mixed-crystal ratio $x_{MAX}$ and the electron velocity at the point of the largest AlAs mixed-crystal ratio for different thicknesses of a graded collector layer.

The following describes the relationship between the maximum mixed-crystal ratio $x_{MAX}$ in the graded collector layer 106A (FIG. 10B) and preferred thicknesses of the graded collector layer 106A with reference to FIG. 6. Changing the maximum AlAs mixed-crystal ratio $x_{MAX}$ not only results in a change in the magnitude of the quasi-electric field but also, as shown in FIGS. 5A and 5B, leads to a change in the electron velocity with the AlAs mixed-crystal ratio x in the graded collector layer 106A. To simplify the calculations of the electron velocity in the graded collector layer 106A, it was assumed that the AlAs mixed-crystal ratio x in the graded collector layer 106A would vary linearly.

FIG. 6 is a graph that shows the relationship between maximum mixed-crystal ratio $x_{MAX}$ and the electron velocity at the point of the largest AlAs mixed-crystal ratio as determined for different thicknesses of the graded collector layer 106A through calculations based on the graphs in FIGS. 5A and 5B. The horizontal axis represents maximum mixed-crystal ratio $x_{MAX}$, and the vertical axis represents electron velocity in the unit of "×10$^7$ cm/s." In the graph in FIG. 6, the thinnest solid line, second-thinnest solid line, and thickest solid line indicate the results of calculations in which the thickness of the graded collector layer 106A was about 200 nm, about 400 nm, and about 600 nm, respectively.

As shown in FIG. 6, the electron velocity reaches a maximum at a certain maximum mixed-crystal ratio $x_{MAX}$ regardless of the thickness of the graded collector layer 106A. It can be seen that the cutoff frequency can be maximized by selecting the maximum mixed-crystal ratio $x_{MAX}$ at which the electron velocity reaches a maximum. This helps understand the trend shown in FIG. 2, in which within the range of maximum mixed-crystal ratios $x_{MAX}$ of about 0.075 or less, the cutoff frequency increases with increasing maximum mixed-crystal ratio $x_{MAX}$ and peaks at a maximum mixed-crystal ratio $x_{MAX}$ of about 0.075 in the high-current region.

As stated, the fastest electron velocity can be used by selecting the best maximum mixed-crystal ratio $x_{MAX}$ according to the thickness of the graded collector layer 34 (FIGS. 1A and 1B) within the range of maximum mixed-crystal ratios $x_{MAX}$ of about 0.025 or more and about 0.125 or less (i.e., from about 0.025 to about 0.125). Maximizing the electron velocity maximizes the cutoff frequency in the high-current region.

Moreover, from FIG. 6, it can be seen that the maximum electron velocity increases with decreasing thickness of the graded collector layer 34. This means that thinning the graded collector layer 34 increases the maximum electron velocity achievable in the presence of the Kirk effect. Thinning the graded collector layer 34 therefore leads to a smaller decrease in cutoff frequency in the high-current region. As a result, such an HBT offers a smaller loss of linear output power as well as the improved linear efficiency owing to the low-concentration collector layer 32.

Advantages of Embodiment 1

The above description of Embodiment 1 gives the following findings.

Making a region of the collector layer 30 (FIGS. 1A and 1B) on the base layer 40 side (corresponding to the low-concentration collector layer 32) a low-concentration region reduces the base-collector voltage dependence of the base-collector capacitance in the same way as in Reference Configuration 1, illustrated in FIG. 10A. This leads to an increase in linear efficiency.

Making a region of the collector layer 30 on the base layer 40 side a low-concentration region, however, affects the linear output power by causing the Kirk effect to be apparent in the high-current region. In Embodiment 1, there is in a low-concentration collector layer 32 a graded collector layer 34 in which the energy band gap narrows in the direction of increasing distance from the base layer 40, and this limits the loss of linear output power resulting from the Kirk effect. In addition to this, setting the strength of the effective electric field within a range that includes the peak electric field strength will ensure that the electron velocity remains high in the low-concentration collector layer 32, resulting in a further improvement in cutoff frequency.

Making the electron affinity of the semiconductor material for the graded collector layer 34 at the point of the largest energy band gap smaller than the electron affinity of the semiconductor material for the base layer 40 and making the difference between the two electron affinities about 0.15 eV or less advantageously limits the loss of linear output power. Making the difference between the two electron affinities about 0.12 eV or less is highly effective in limiting the loss of linear output power, and making the difference about 0.09 eV or less is more effective.

Variation of Embodiment 1

The following describes a variation of Embodiment 1. In Embodiment 1, as illustrated in FIGS. 1A and 1B, the graded collector layer 34 is inside the low-concentration collector layer 32 in the thickness direction. That is, there are layers of the low-concentration collector layer 32 other than the graded collector layer 34 between the graded collector layer 34 and the base layer 40 and between the graded collector layer 34 and the high-concentration collector layer 31. Alternatively, the graded collector layer 34 may be in direct contact with one of the base layer 40 and the high-concentration collector layer 31 or both.

Although in Embodiment 1 the graded collector layer 34 is an AlGaAs layer, other mixed-crystal semiconductor materials may also be used. For example, the graded collector layer 34 can be a layer of GaInNAs, InGaAs, or GaAsSb, to name but a few.

Embodiment 2

Figure 7:
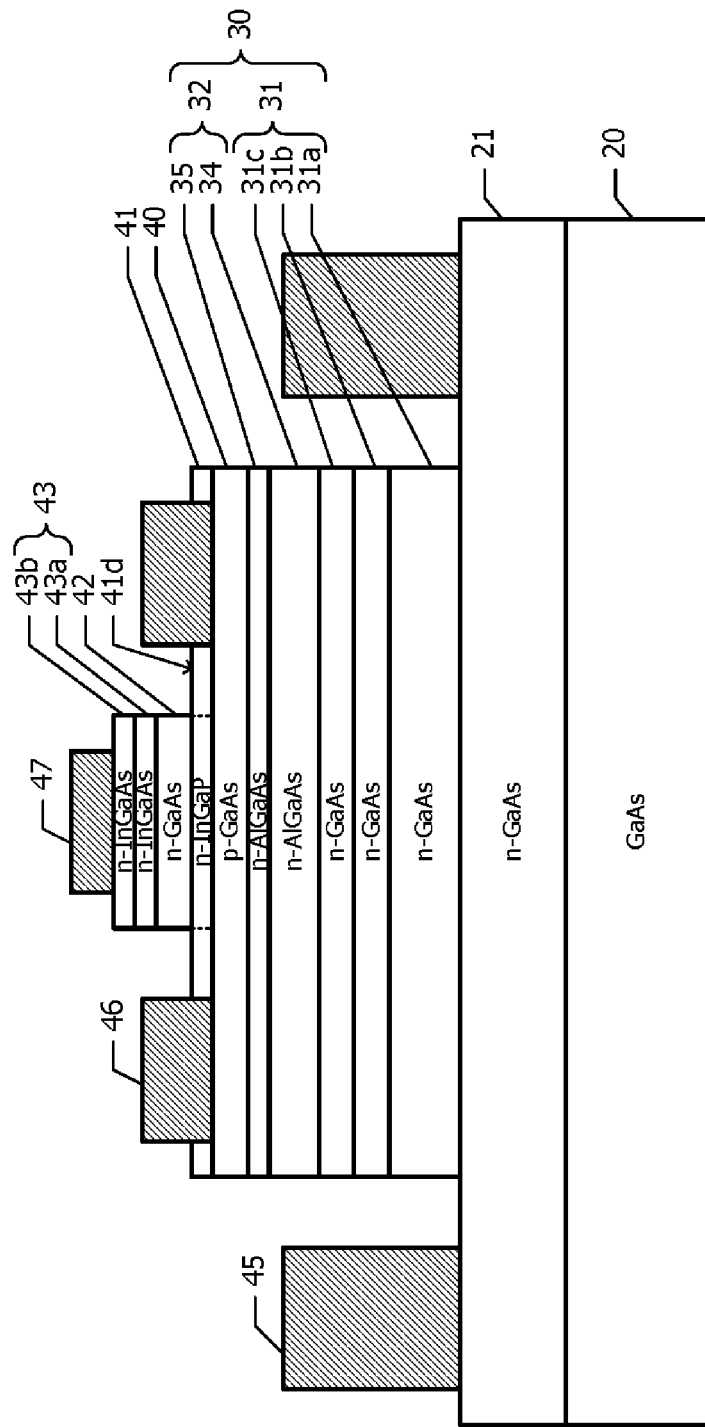
FIG. 7 is a schematic cross-sectional view of an HBT according to Embodiment 2.
Figure 8A:
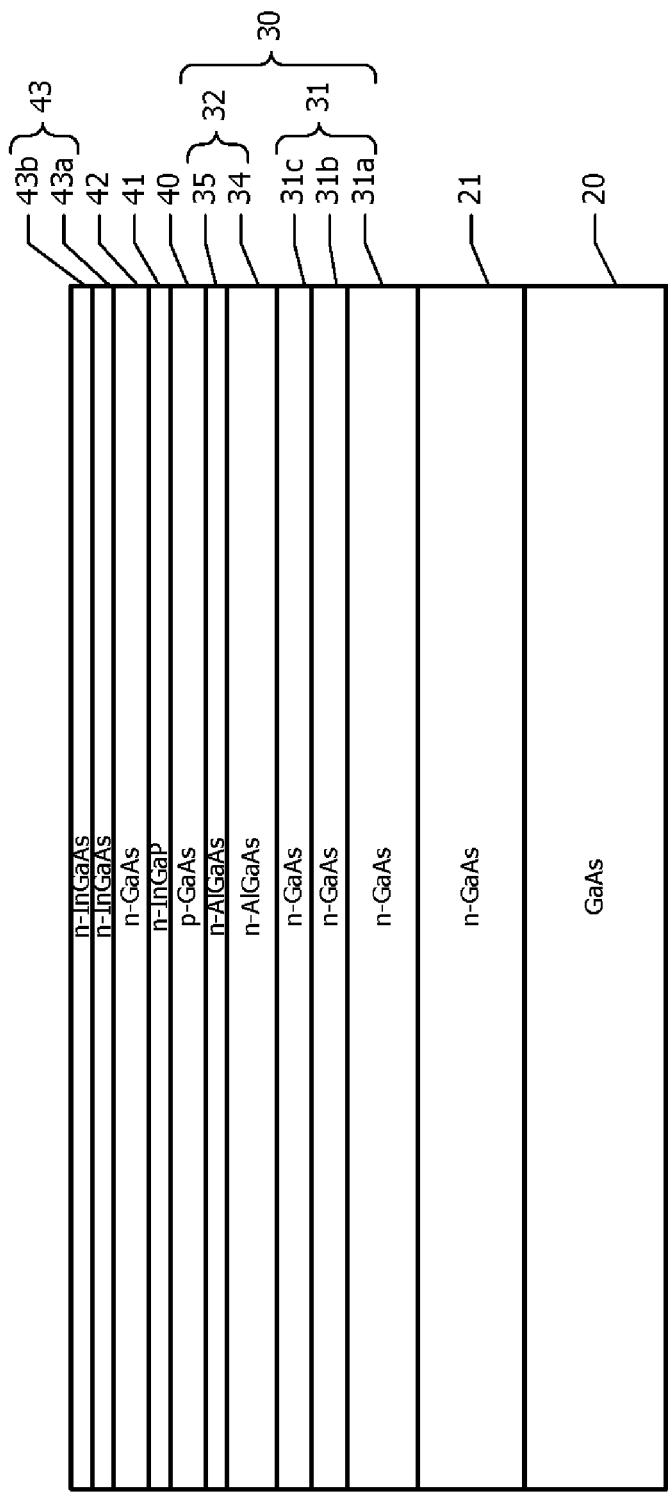
FIG. 8A is a schematic cross-sectional view of an HBT according to Embodiment 2 in production.
Figure 8B:
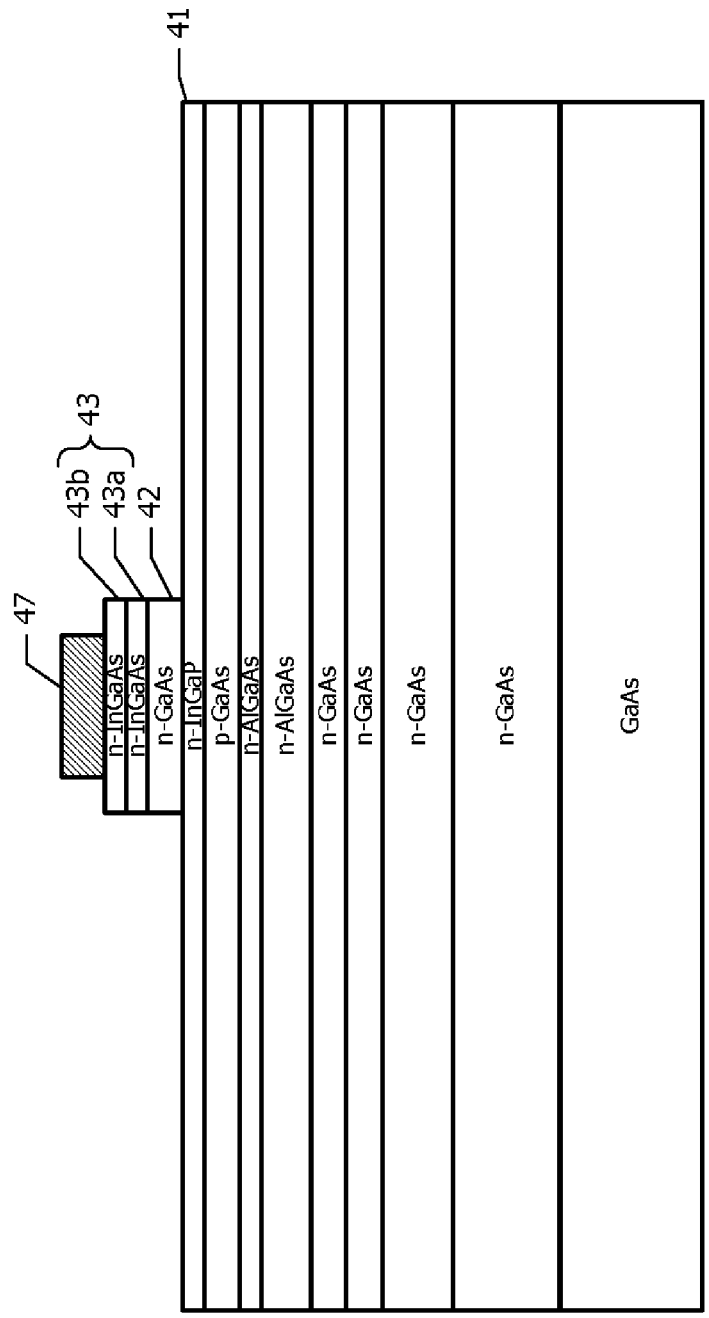
FIG. 8B is a schematic cross-sectional view of an HBT according to Embodiment 2 in production.
Figure 8C:
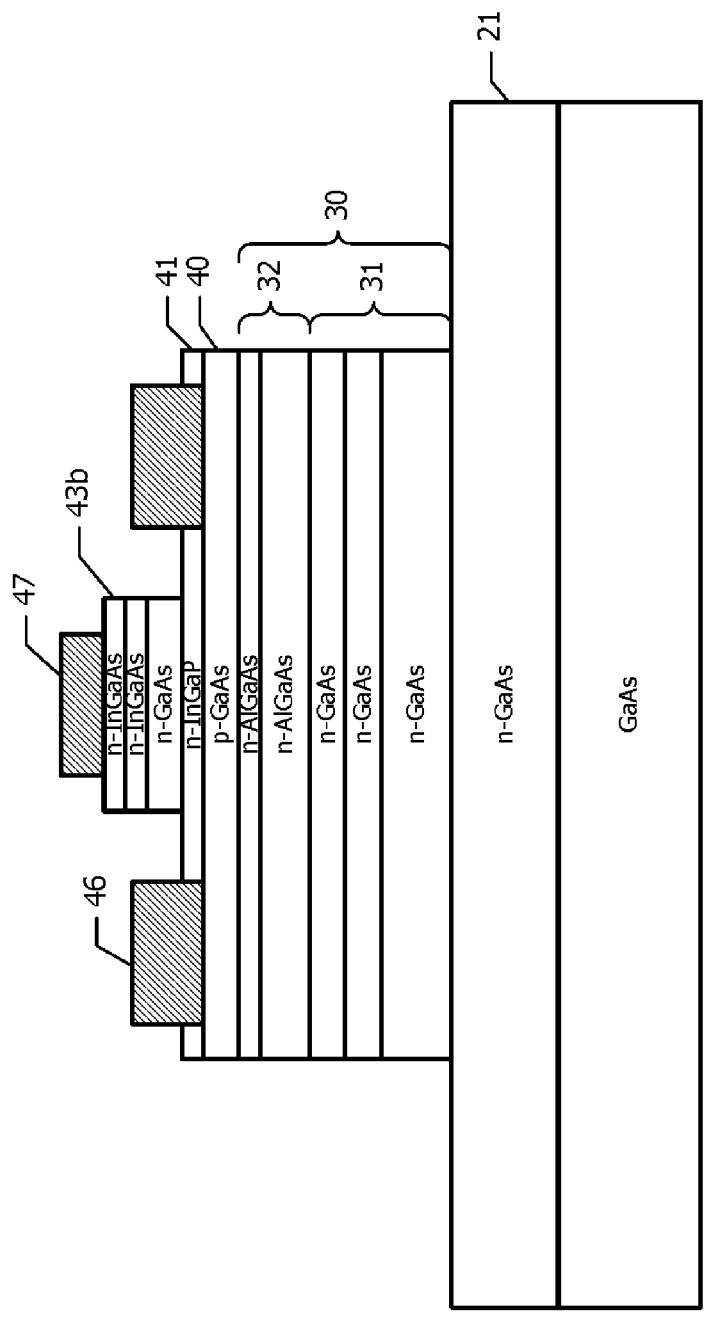
FIG. 8C is a schematic cross-sectional view of an HBT according to Embodiment 2 in production.
Figure 8D:
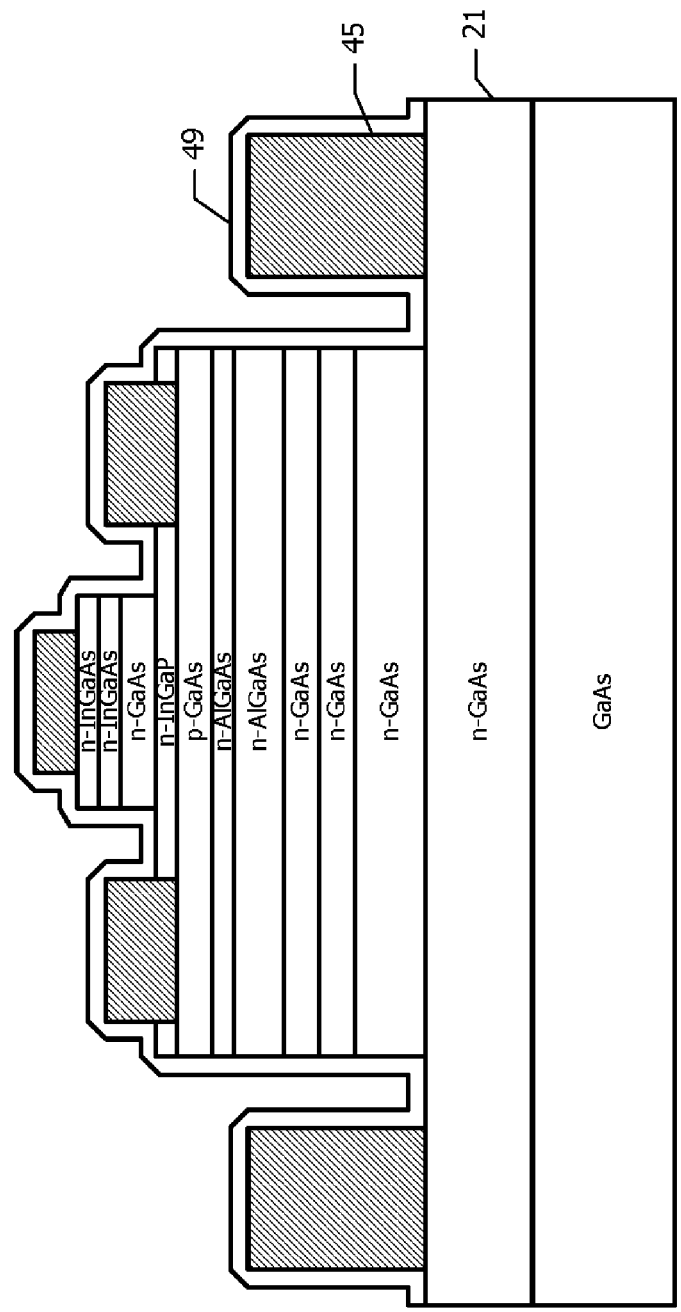
FIG. 8D is a schematic cross-sectional view of a finished HBT according to Embodiment 2.

The following describes an HBT according to Embodiment 2 with reference to FIG. 7 to FIG. 8D. In the following, the elements this embodiment has in common with Embodiment 1 may be mentioned without description.

FIG. 7 is a schematic cross-sectional view of an HBT according to Embodiment 2. The individual elements of the HBT illustrated in FIG. 7 are given the same reference numerals as the reference numerals given to the corresponding elements of the HBT according to Embodiment 1 illustrated in FIG. 1A.

The high-concentration collector layer 31 includes, in order from the substrate 20 side, a lower collector layer 31a, a middle collector layer 31b, and an upper collector layer 31c. The graded collector layer 34 of the low-concentration collector layer 32 is in direct contact with the high-concentration collector layer 31. The low-concentration collector layer 32 further includes a reversely graded collector layer 35 between the graded collector layer 34 and the base layer 40. Whereas the energy band gap of the graded collector layer 34 narrows with increasing distance from the base layer 40, the energy band gap of the reversely graded collector layer 35 broadens with increasing distance from the base layer 40.

There is an emitter layer 41 on the entire surface of the base layer 40. It should be noted that the emitter layer 41 is depleted in the region 41d, or except immediately beneath the cap layer 42. The base electrode 46 is inside openings created in the emitter layer 41, making ohmic contact with the base layer 40.

The contact layer 43 includes a lower contact layer 43a and an upper contact layer 43b thereon. The lower contact layer 43a has varying mixed-crystal ratios in the thickness direction and functions to relax distortion.

The following gives an example of the material for, dopant concentration of, and thickness of each layer. The substrate 20 is a semi-insulating GaAs substrate.

The subcollector layer 21 is formed of n-type GaAs, its silicon (Si) concentration is about $2 \times 10^{18}$ cm$^{-3}$ or more and about $6 \times 10^{18}$ cm$^{-3}$ or less (i.e., from about $2 \times 10^{18}$ cm$^{-3}$ to about $6 \times 10^{18}$ cm$^{-3}$), and its thickness is about 0.3 µm or more and about 1.0 µm or less (i.e., from about 0.3 µm to about 1.0 µm).

The high-concentration collector layer 31 is formed of n-type GaAs. The Si concentration of the lower collector layer 31a, a layer in the high-concentration collector layer 31, is about $1 \times 10^{18}$ cm$^{-3}$ or more and about $5 \times 10^{18}$ cm$^{-3}$ or less (i.e., from about $1 \times 10^{18}$ cm$^{-3}$ to about $5 \times 10^{18}$ cm$^{-3}$), typically about $3 \times 10^{18}$ cm$^{-3}$. The thickness of the lower collector layer 31a is about 200 nm or more and about 900 nm or less (i.e., from about 200 nm to about 900 nm), typically about 500 nm. As can be seen, the lower collector layer 31a has a dopant concentration similar to the dopant concentration of the subcollector layer 21 and a thickness similar to the thickness of the subcollector layer 21. The middle collector layer 31b has a Si concentration of about $3 \times 10^{16}$ cm$^{-3}$ or more and about $7 \times 10^{16}$ cm$^{-3}$ or less (i.e., from about $3 \times 10^{16}$ cm$^{-3}$ to about $7 \times 10^{16}$ cm$^{-3}$), typically about $5 \times 10^{16}$ cm$^{-3}$, and a thickness of about 100 nm or more and 300 nm or less (i.e., from about 100 nm to about 300 nm), typically about 200 nm. The upper collector layer 31c has a Si concentration of about $1 \times 10^{16}$ cm$^{-3}$ or more and about $4 \times 10^{16}$ cm$^{-3}$ or less (i.e., from about $1 \times 10^{16}$ cm$^{-3}$ to about $4 \times 10^{16}$ cm$^{-3}$), typically about $1.5 \times 10^{16}$ cm$^{-3}$, and a thickness of about 100 nm or more and about 300 nm or less (i.e., from about 100 nm to about 300 nm), typically about 220 nm.

The low-concentration collector layer 32 is formed of n-type AlGaAs, its Si concentration is about $3\times10^{15}$ cm$^{-3}$ or less, typically about $3\times10^{15}$ cm$^{-3}$, and its thickness is about 300 nm or more and about 500 nm or less (i.e. from about 300 nm to about 500 nm), typically about 400 nm.

The AlAs mixed-crystal ratio x in the graded collector layer 34 varies linearly from about 0 to about 0.05 in the direction from the interface with the high-concentration collector layer 31 to the interface with the reversely graded collector layer 35. The thickness of the graded collector layer 34 is about 350 nm. The AlAs mixed-crystal ratio x in the reversely graded collector layer 35 varies linearly from about 0.05 to about 0 in the direction from the interface with the graded collector layer 34 to the interface with the base layer 40.

The base layer 40 is formed of p-type GaAs, its C concentration is about $2\times10^{19}$ cm$^{-3}$ or more and about $5\times10^{19}$ cm$^{-3}$ or less (i.e., from about $2\times10^{19}$ cm$^{-3}$ to about $5\times10^{19}$ cm$^{-3}$), and its thickness is about 50 nm or more and about 150 nm or less (i.e., from about 50 nm to about 150 nm).

The emitter layer 41 is formed of n-type InGaP, its InP mixed-crystal ratio is about 0.5, its Si concentration is about $2\times10^{17}$ cm$^{-3}$ or more and about $5\times10^{17}$ cm$^{-3}$ or less (i.e., from about $2\times10^{17}$ cm$^{-3}$ to about $5\times10^{17}$ cm$^{-3}$), and its thickness is about 30 nm or more and about 50 nm or less (i.e., from about 30 nm to about 50 nm).

The cap layer 42 is formed of n-type GaAs, its Si concentration is about $2\times10^{18}$ cm$^{-3}$ or more and about $4\times10^{18}$ cm$^{-3}$ or less (i.e., from about $2\times10^{18}$ cm$^{-3}$ to about $4\times10^{18}$ cm$^{-3}$), and its thickness is about 50 nm or more and 150 nm or less (i.e., from about 50 nm to about 150 nm).

The contact layer 43 is formed of n-type InGaAs, and its Si concentration is about $1\times10^{19}$ cm$^{-3}$ or more and about $3\times10^{19}$ cm$^{-3}$ or less (i.e., from about $1\times10^{19}$ cm$^{-3}$ to about $3\times10^{19}$ cm$^{-3}$). The thickness of the lower contact layer 43a is about 30 nm or more and about 70 nm or less (i.e., from about 30 nm to about 70 nm), and the InAs mixed-crystal ratio in this layer varies from about 0 to about 0.5 in the direction from the interface with the cap layer 42 to the interface with the upper contact layer 43b. The upper contact layer 43b has an InAs mixed-crystal ratio of about 0.5 and a thickness of about 30 nm or more and 70 nm or less (i.e., from about 30 nm to about 70 nm).

The collector electrode 45 has a multilayer structure in which, in order from the bottom, an about 60-nm thick AuGe layer, an about 10-nm thick Ni layer, an about 200-nm Au layer, an about 10-nm thick Mo layer, and an about 1-µm thick Au layer are stacked. The base electrode 46 and emitter electrode 47 have a multilayer structure in which, in order from the bottom, an about 50-nm thick Ti layer, an about 50-nm thick Pt layer, and an about 200-nm thick Au layer are stacked.

The following describes a method for the production of an HBT according to Embodiment 2 with reference to FIG. 8A to FIG. 8D.

As illustrated in FIG. 8A, on a semi-insulating single-crystal GaAs substrate 20, a subcollector layer 21, a high-concentration collector layer 31, a low-concentration collector layer 32, a base layer 40, an emitter layer 41, a cap layer 42, and a contact layer 43 are epitaxially grown one after another. This epitaxial growth can be performed using, for example, metalorganic chemical vapor deposition (MOCVD). The n-type dopant can be Si, and the p-type dopant can be C. The upper contact layer 43b may be doped with Se, Te, or any similar element to achieve a higher concentration. The subcollector layer 21 may be doped with Te or any similar element to achieve a higher concentration.

As illustrated in FIG. 8B, an emitter electrode 47 is formed on the upper contact layer 43b. Then, the upper contact layer 43b, lower contact layer 43a, and cap layer 42 are etched away to the top surface of the emitter layer 41 using a photoresist mask in a predetermined pattern as etching mask. After this etching, the photoresist mask, used as etching mask, is removed. This leaves a mesa structure formed by the upper contact layer 43b, lower contact layer 43a, and cap layer 42.

As illustrated in FIG. 8C, a photoresist mask for patterning the emitter layer 41, base layer 40, and collector layer 30 is formed. Using this photoresist mask as etching mask, the emitter layer 41, base layer 40, and collector layer 30 are etched away to the top surface of the subcollector layer 21. After this etching, the photoresist mask, used as etching mask, is removed. This leaves a mesa structure formed by the emitter layer 41, base layer 40, and collector layer 30.

After that, the emitter layer 41 in the regions in which a base electrode 46 is to be formed is removed to expose the base layer 40. On the exposed base layer 40, a base electrode 46 is formed. After the formation of the base electrode 46, alloying is performed to achieve an ohmic contact between the emitter electrode 47 and the upper contact layer 43b and an ohmic contact between the base electrode 46 and the base layer 40.

As illustrated in FIG. 8D, a collector electrode 45 is formed on the subcollector layer 21. After that, alloying is performed to achieve an ohmic contact between the collector electrode 45 and the subcollector layer 21. Then, a protective film 49 is formed to cover the entire top surface of the HBT. The protective film 49 can be, for example, a silicon nitride (SiN) film.

Although not particularly mentioned in the above description, it is preferred to place any necessary etching stopper layer, a layer having etching characteristics different from those of the semiconductor layers to be etched, at the interfaces at which etching should be stopped.

Advantages of Embodiment 2

The following describes great advantages of Embodiment 2.

In Embodiment 2, the AlAs mixed-crystal ratio x in the graded collector layer 34 (FIG. 7) at the point of the largest energy band gap (interface between the graded collector layer 34 and the reversed graded collector layer 35) is set to about 0.05. That is, the maximum mixed-crystal ratio $x_{MAX}$ is set to about 0.05. This mitigates, as can be seen from FIG. 2, the blocking effect against electron transport that occurs in the collector layer 30, and at the same time reduces the decrease in cutoff frequency that occurs in the presence of the Kirk effect. In other words, improvement in linear efficiency and limitation to the loss of linear output power are achieved.

When the maximum mixed-crystal ratio $x_{MAX}$ in and thickness of the graded collector layer 34 (FIG. 7) are set to about 0.05 and about 400 nm, respectively, the electron velocity is about $1.2\times10^7$ cm/s, as shown in FIG. 6. This value is approximately 80% of the maximum electron density that can be achieved with an about 400-nm thick graded collector layer 34, about $1.5\times10^7$ cm/s. A sufficiently high electron velocity is therefore attained. The maximum mixed-crystal ratio $x_{MAX}$ may be selected from the range of about 0.03 or more and about 0.125 or less (i.e., about 0.03 to about 0.125). In this case, the electron velocity is equal to or faster than about 70% of the maximum. In particular, setting the maximum mixed-crystal ratio $x_{MAX}$ to about 0.1 leads to an electron velocity substantially equal to the maximum of about $1.5 \times 10^7$ cm/s.

It can be seen from FIG. 6 that when the thickness of the graded collector layer 34 is set to about 200 nm, the maximum mixed-crystal ratio $x_{MAX}$ can be selected from the range of about 0.025 or more and about 0.125 or less (i.e., from about 0.025 to about 0.125). In particular, setting the maximum mixed-crystal ratio $x_{MAX}$ to about 0.05 leads to an electron velocity substantially equal to the maximum electron velocity of about $1.8 \times 10^7$ cm/s.

When the thickness of the graded collector layer 34 falls within the range of about 200 nm or more and about 600 nm or less (i.e., from about 200 nm to about 600 nm), setting the maximum mixed-crystal ratio $x_{MAX}$ to about 0.025 or more and about 0.125 or less (i.e., from about 0.025 to about 0.125) leads to an electron velocity approximately 70% of the maximum electron velocity. This results in a further increase in the output power and efficiency of the HBT.

In Embodiment 2, a lower collector layer 31a having a dopant concentration substantially equal to the dopant concentration of the subcollector layer 21 is interposed between the middle collector layer 31b and the subcollector layer 21. The lower collector layer 31a reduces the collector resistance by acting as resistor inserted in parallel with the subcollector layer 21. This results in a further increase in the output power and efficiency of the HBT.

In Embodiment 2, in the formation of the collector layer 30 in the epitaxial growth step illustrated in FIG. 8A, the graded collector layer 34 and reversely graded collector layer 35 can be formed sequentially on the high-concentration collector layer 31. Moreover, in the etching step illustrated in FIG. 8B, it is possible to remove the contact layer 43 and cap layer 42 sequentially. In the etching step illustrated in FIG. 8C, continuous etching from the emitter layer 41 to the surface of the subcollector layer 21 is possible. Thus, there is no need to add a new step to a known process for the production of an HBT, in which the graded collector layer 34 and reversely graded collector layer 35 are not provided. In this way, the manufacturer can produce an HBT according to Embodiment 2 using a known process for the production of an HBT as it is, without causing the complication of the process, and, therefore, can avoid production cost increases.

In Embodiment 2, the dopant concentrations of the middle collector layer 31b, upper collector layer 3c, and low-concentration collector layer 32 are equal to or less than about 1/10 of the dopant concentrations of the subcollector layer 21 and lower collector layer 3a. Setting dopant concentrations as such prevents a decrease in base-collector breakdown voltage and collector emitter breakdown voltage. As a result, the breakdown of the HBT is prevented that would otherwise occur when the output voltage swings to a maximum extent at full high-frequency output power.

In Embodiment 2, the low-concentration collector layer 32 is n-type, and its dopant concentration is set to about $3 \times 10^{15}$ cm$^{-3}$ or less. Setting the concentration of the low-concentration collector layer 32 lower further improves the linear efficiency. In other configurations, the low-concentration collector layer 32 may be formed of p-type AlGaAs with a C concentration of about $1 \times 10^{15}$ cm$^{-3}$ or less, or alternatively the low-concentration collector layer 32 may be formed of intrinsic AlGaAs.

Variation of Embodiment 2

Although in Embodiment 2 the low-concentration collector layer 32 is formed into a two-layer structure composed of a graded collector layer 34 and a reversely graded collector layer 35, the reverse graded collector layer 35 is optional.

Figure 9:
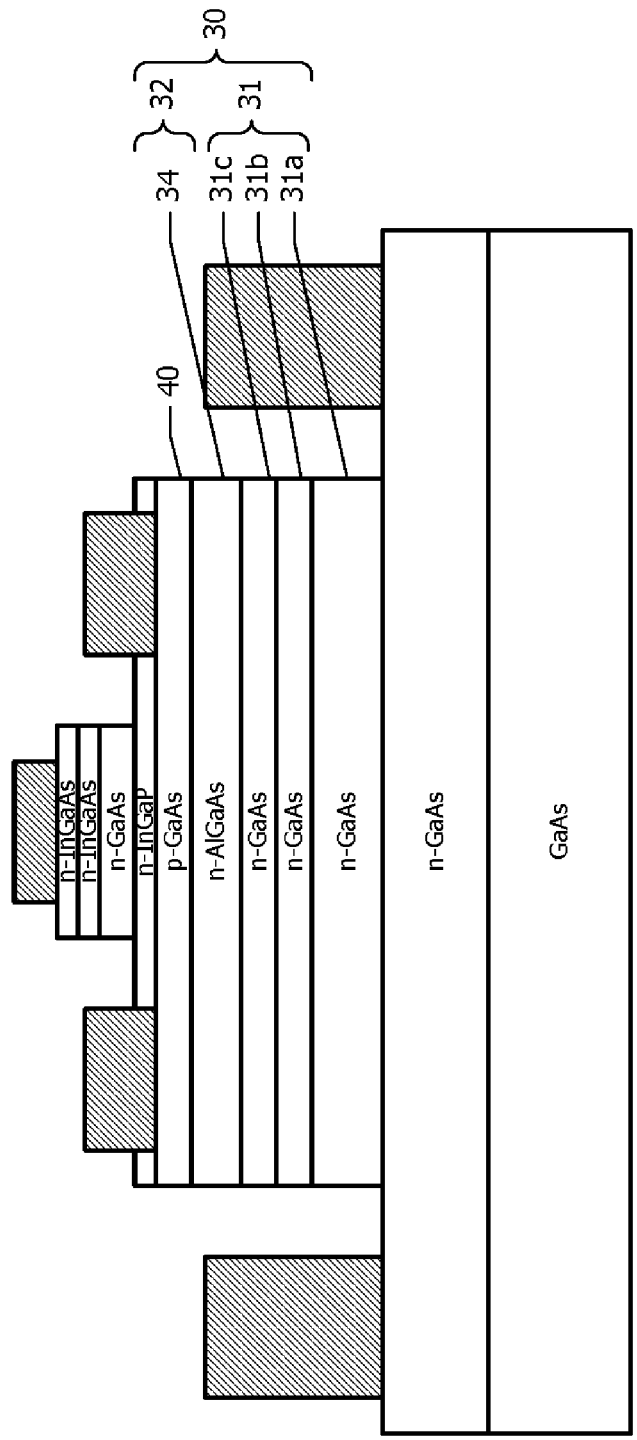
FIG. 9 is a schematic cross-sectional view of an HBT according to a variation of an HBT according to Embodiment 2, a variation in which no reversely graded collector layer is provided.

FIG. 9 is a schematic cross-sectional view of an HBT according to a variation in which the reversely graded collector layer 35 is not provided. The entire low-concentration collector layer 32 is a graded collector layer 34. The energy band gap of the graded collector layer 34 is the largest at the interface between the graded collector layer 34 and the base layer 40. Even such a configuration, in which the reversely graded collector layer 35 is not provided, gives advantages similar to those in Embodiment 2.

Although in Embodiment 2 the high-concentration collector layer 31 (FIG. 7) is structured into three layers with different dopant concentrations, this layer may be formed into a single-layer or two-layer structure, or alternatively into a multilayer structure composed of four or more layers. Moreover, the two layers of the middle collector layer 31b and upper collector layer 31c may be replaced with one layer in which the dopant concentration is varied so that the dopant concentration becomes higher with increasing distance from the interface with the low-concentration collector layer 32. It is also possible to replace the three layers constituting the high-concentration collector layer 31 with one layer in which the dopant concentration is varied so that the dopant concentration becomes higher with increasing distance from the interface with the low-concentration collector layer 32. A more common configuration can also be used in which the high-concentration collector layer 31 is structured into a single layer or multiple layers at least one of which is configured such that the dopant concentration becomes gradually higher from the base layer 40 side to the subcollector layer 21 side.

Other Variations

Although in Embodiments 1 and 2 the emitter layer, base layer, and collector layer are InGaP, GaAs, and AlGaAs layers, respectively, the technical ideas behind the HBTs according to Embodiments 1 and 2 can also be applied to HBTs such as HBTs of InGaAsP/GaAs type, HBTs of AlGaAs/GaAs type, HBTs of InGaP/GaAsSb type, HBTs of InP/InGaAs type, HBTs of InAlAs/InGaAs type, HBTs of Si/SiGe type, HBTs of AlGaN/GaN type, and HBTs of GaN/InGaN type. For example, the emitter layer/base layer/collector layer combination can be selected from combinations such as InGaP/GaAs/GaInNAs, AlGaAs/GaAs/AlGaAs, AlGaAs/GaAs/GaInNAs, InGaP/InGaAs/AlGaAs, InGaP/InGaAs/GaInNAs, InGaP/GaAsSb/AlGaAs, InGaP/GaAsSb/GaInNAs, InGaP/AlGaAs/AlGaAs, InGaP/AlGaAs/GaInNAs, InGaP/GaInNAs/AlGaAs, and InGaP/GaInNAs/GaInNAs.

In Embodiments 1 and 2, the graded collector layer 34 is included in the low-concentration collector layer 32. A graded semiconductor layer in which the energy band gap narrows from the base layer 40 side to the substrate 20 side may be provided extending from the low-concentration collector layer 32 to part of the high-concentration collector layer 31. That is, part of the high-concentration collector layer 31 may be a graded semiconductor layer that has energy band gaps narrowing from the low-concentration collector layer 32 side to the substrate 20 side.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A heterojunction bipolar transistor comprising
a substrate; and
a multilayer structure on the substrate, the multilayer structure including a collector layer, a p-type base layer, and an n-type emitter layer, wherein
the collector layer includes a high-concentration collector layer and a low-concentration collector layer between the base layer and the high-concentration collector layer, the low-concentration collector layer having a lower dopant concentration than the high-concentration collector layer does,
the low-concentration collector layer includes a graded collector layer in which an energy band gap varies to narrow with increasing distance from the base layer, and
an electron affinity of a semiconductor material for the base layer is greater than an electron affinity of a semiconductor material for the graded collector layer at a point of a largest energy band gap by about 0.15 eV or less.

2. The heterojunction bipolar transistor according to claim 1, further comprising an n-type subcollector layer on the substrate, wherein
the collector layer, base layer, and emitter layer are stacked in this order on part of a surface region of the subcollector layer, and the high-concentration collector layer includes a first layer on a subcollector layer side and a second layer on a low-concentration collector layer side, and
a dopant concentration of the first layer and a dopant concentration of the subcollector layer are higher than a dopant concentration of the second layer.

3. The heterojunction bipolar transistor according to claim 1, wherein
the low-concentration collector layer includes a reversely graded collector layer between the graded collector layer and the base layer,
an energy band gap of the reversely graded collector layer varies in a thickness direction, the energy band gap of the reversely graded collector layer at an interface on a base layer side is equal to an energy band gap of the base layer, and
at an interface between the graded collector layer and the reversely graded collector layer, an energy band gap of the graded collector layer and the energy band gap of the reversely graded collector layer are equal.

4. The heterojunction bipolar transistor according to claim 1, wherein the base layer includes GaAs, the graded collector layer includes AlGaAs, and an AlAs mixed-crystal ratio decreases with increasing distance from the base layer.

5. The heterojunction bipolar transistor according to claim 1, wherein the base layer includes GaAs, GaAsSb, InGaAs or InGaAsN.

6. The heterojunction bipolar transistor according to claim 1, wherein the graded collector layer includes a ternary or quaternary compound semiconductor.

7. The heterojunction bipolar transistor according to claim 1, wherein the graded collector layer includes a semiconductor material in which an electron velocity peaks at a certain electric field strength when an electric field strength is varied.

8. The heterojunction bipolar transistor according to claim 2, wherein the dopant concentration of the second layer and a dopant concentration of the low-concentration collector layer are equal to or less than about 1/10 of the dopant concentration of the first layer.

9. The heterojunction bipolar transistor according to claim 4, wherein the AlAs mixed-crystal ratio in the graded collector layer at an interface on a base layer side is from about 0.025 to about 0.125.

10. The heterojunction bipolar transistor according to claim 6, wherein the graded collector layer includes AlGaAs or InGaAsN.

11. A heterojunction bipolar transistor comprising
a substrate; and
a multilayer structure on the substrate, the multilayer structure including a collector layer, a p-type base layer, and an n-type emitter layer, wherein
the collector layer includes a high-concentration collector layer, and a low-concentration collector layer between the base layer and the high-concentration collector layer, the low-concentration collector layer having a lower dopant concentration than the high-concentration collector layer does,
the low-concentration collector layer includes a graded collector layer in which an energy band gap varies to narrow with increasing distance from the base layer,
the graded collector layer is formed of a semiconductor different from a semiconductor forming the base layer, and
an electron affinity of a semiconductor material for the base layer is greater than an electron affinity of a semiconductor material for the graded collector layer at a point of a largest energy band gap by about 0.15 eV or less.

12. The heterojunction bipolar transistor according to claim 11, wherein the base layer includes GaAs, GaAsSb, InGaAs or InGaAsN.

13. The heterojunction bipolar transistor according to claim 11, wherein the graded collector layer includes a ternary or quaternary compound semiconductor.

14. The heterojunction bipolar transistor according to claim 11, further comprising an n-type subcollector layer on the substrate, wherein
the collector layer, base layer, and emitter layer are stacked in this order on part of a surface region of the subcollector layer, and the high-concentration collector layer includes a first layer on a subcollector layer side and a second layer on a low-concentration collector layer side, and
a dopant concentration of the first layer and a dopant concentration of the subcollector layer are higher than a dopant concentration of the second layer.

15. The heterojunction bipolar transistor according to claim 11, wherein the base layer includes GaAs, the graded collector layer includes AlGaAs, and an AlAs mixed-crystal ratio decreases with increasing distance from the base layer.

16. The heterojunction bipolar transistor according to claim 11, wherein
the low-concentration collector layer includes a reversely graded collector layer between the graded collector layer and the base layer,
an energy band gap of the reversely graded collector layer varies in a thickness direction, the energy band gap of the reversely graded collector layer at an interface on a base layer side is equal to an energy band gap of the base layer, and at an interface between the graded collector layer and the reversely graded collector layer, an energy band gap of the graded collector layer and the energy band gap of the reversely graded collector layer are equal.

17. The heterojunction bipolar transistor according to claim 11, wherein the graded collector layer includes a semiconductor material in which an electron velocity peaks at a certain electric field strength when an electric field strength is varied.

18. The heterojunction bipolar transistor according to claim 13, wherein the graded collector layer includes AlGaAs or InGaAsN.

19. The heterojunction bipolar transistor according to claim 14, wherein the dopant concentration of the second layer and a dopant concentration of the low-concentration collector layer are equal to or less than about $1/10$ of the dopant concentration of the first layer.

20. The heterojunction bipolar transistor according to claim 15, wherein the AlAs mixed-crystal ratio in the graded collector layer at an interface on a base layer side is from about 0.025 to about 0.125.

* * * * *